US011919298B2

(12) United States Patent
Ide et al.

(10) Patent No.: US 11,919,298 B2
(45) Date of Patent: *Mar. 5, 2024

(54) DRIVING CIRCUIT AND LIQUID EJECTING APPARATUS

(71) Applicant: Seiko Epson Corporation, Tokyo (JP)

(72) Inventors: Noritaka Ide, Shiojriri (JP); Kunio Tabata, Shiojiri (JP)

(73) Assignee: SEIKO EPSON CORPORATION (JP)

(*) Notice: Subject to any disclaimer, the term of this patent is extended or adjusted under 35 U.S.C. 154(b) by 135 days.

This patent is subject to a terminal disclaimer.

(21) Appl. No.: 17/488,426

(22) Filed: Sep. 29, 2021

(65) Prior Publication Data

US 2022/0097358 A1 Mar. 31, 2022

(30) Foreign Application Priority Data

Sep. 30, 2020 (JP) ................................ 2020-165283

(51) Int. Cl.
*B41J 29/38* (2006.01)
*B41J 2/045* (2006.01)
*H03K 3/037* (2006.01)
*H03K 17/687* (2006.01)

(52) U.S. Cl.
CPC ......... *B41J 2/0455* (2013.01); *B41J 2/04541* (2013.01); *B41J 2/04548* (2013.01); *B41J 2/04581* (2013.01); *B41J 2/04588* (2013.01); *H03K 3/037* (2013.01); *H03K 17/6871* (2013.01)

(58) Field of Classification Search
CPC ... B41J 2/04541; B41J 2/0455; B41J 2/04581
See application file for complete search history.

(56) References Cited

U.S. PATENT DOCUMENTS

| 8,757,749 | B2 | 6/2014 | Oshima et al. |
| 9,579,886 | B2 | 2/2017 | Sano |
| 2009/0195576 | A1 | 8/2009 | Oshima |
| 2010/0127777 | A1 | 5/2010 | Yoshino et al. |
| 2010/0188452 | A1 | 7/2010 | Oshima |

(Continued)

FOREIGN PATENT DOCUMENTS

| JP | 2009-166349 A | 7/2009 |
| JP | 2010-114500 A | 5/2010 |
| JP | 2010-130340 A | 6/2010 |

*Primary Examiner* — Lam S Nguyen

(74) *Attorney, Agent, or Firm* — Harness, Dickey & Pierce, P.L.C.

(57) ABSTRACT

A driving circuit includes an amplification circuit configured to output an amplified modulation signal and a level shift circuit. The level shift circuit includes a second gate driver that outputs a third gate signal and a fourth gate signal, a third transistor that operates based on the third gate signal, and a fourth transistor that operates based on the fourth gate signal. The second gate driver outputs the third gate signal for controlling the third transistor to be conductive and the fourth gate signal for controlling the fourth transistor to be nonconductive in a second period in which a driving signal is fixed in a second potential that is higher than a first potential and lower than a third potential and the fourth gate signal for controlling the fourth transistor to be nonconductive.

11 Claims, 10 Drawing Sheets

(56) References Cited

U.S. PATENT DOCUMENTS

2012/0182339 A1* 7/2012 Oshima ............... B41J 2/04541
   347/10
2013/0162351 A1   6/2013 Yoshino et al.
2015/0062207 A1* 3/2015 Abe .................... B41J 2/04541
   347/5
2016/0221331 A1* 8/2016 Sano .................... B41J 2/0459

* cited by examiner

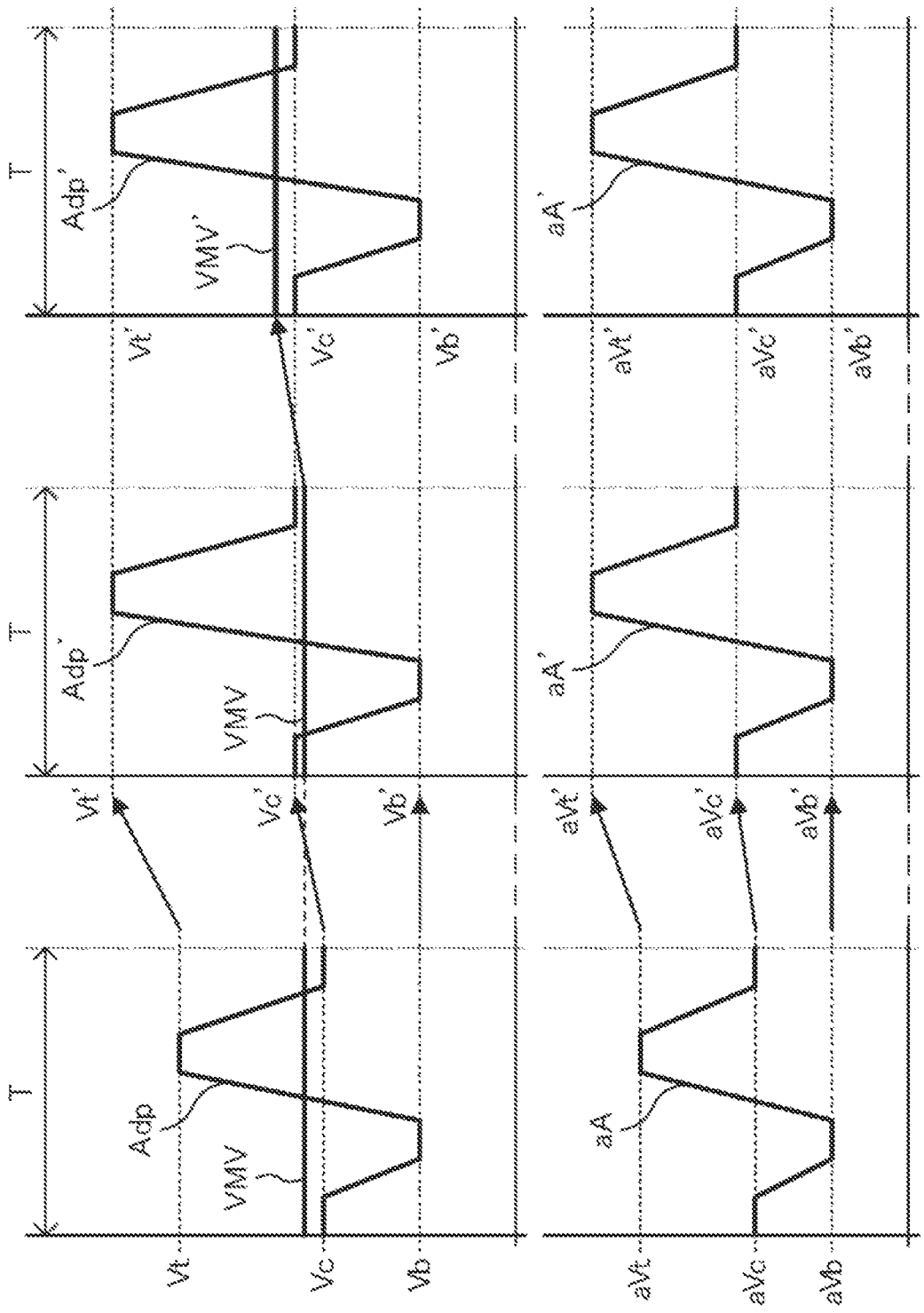

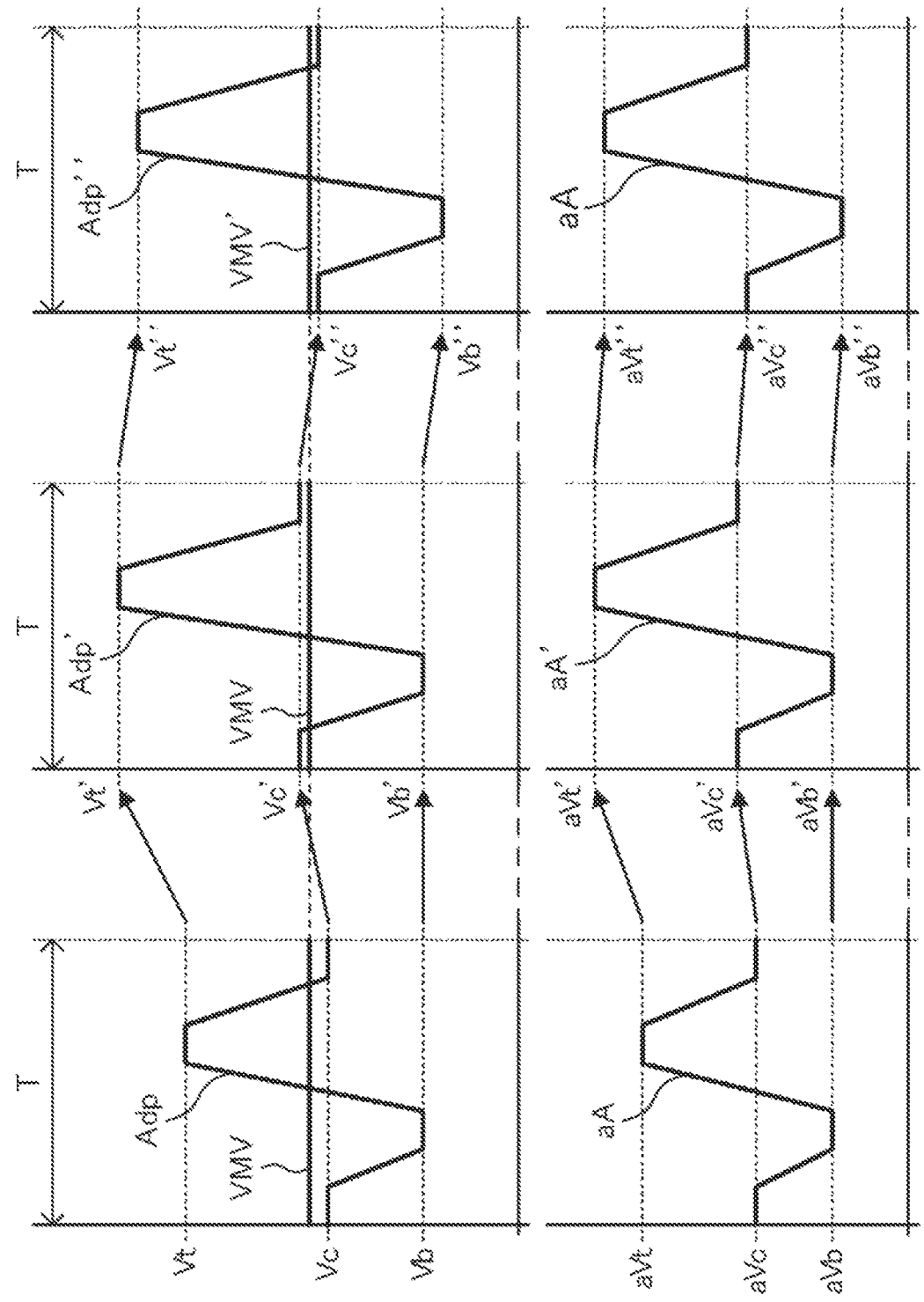

FIG. 10A
FIG. 10B
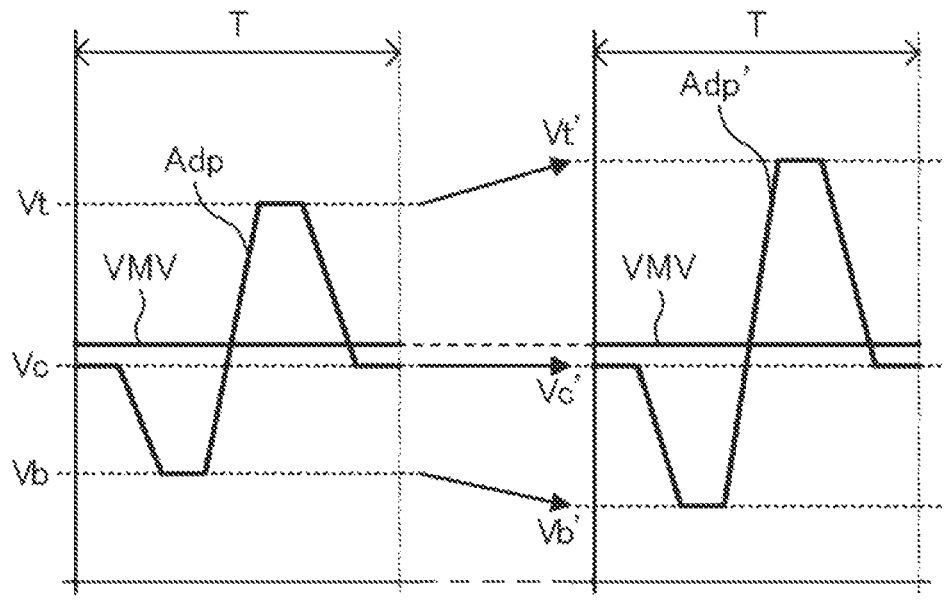
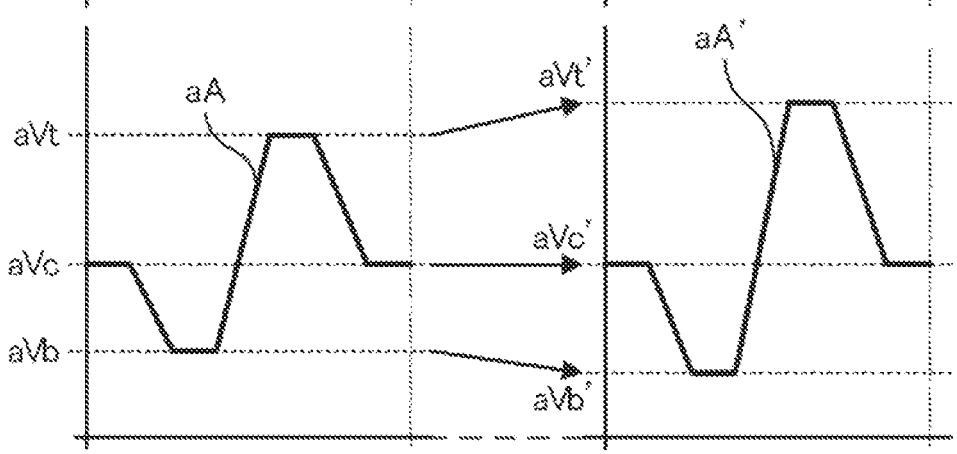

DRIVING CIRCUIT AND LIQUID EJECTING APPARATUS

The present application is based on, and claims priority from JP Application Serial Number 2020-165283, filed Sep. 30, 2020, the disclosure of which is hereby incorporated by reference herein in its entirety.

BACKGROUND

1. Technical Field

The present disclosure relates to a driving circuit and a liquid ejecting apparatus.

2. Related Art

Ink jet printers that include driving elements, such as piezoelectric elements, are known for printing images and documents by ejecting ink. Such piezoelectric elements are disposed so as to correspond to a plurality of nozzles in a head unit and are driven in accordance with driving signals. By this, a predetermined amount of ink (liquid) is ejected at a predetermined timing from the nozzles so as to form dots on a medium. The piezoelectric elements have a capacitive load electrically functioning as a capacitor, and therefore, a sufficient amount of current is required to be supplied to the piezoelectric elements to operate the piezoelectric elements of the nozzles. Therefore, the piezoelectric elements are driven by an amplification circuit amplifying a source signal to obtain a driving signal to be supplied to the head unit.

JP-A-2009-166349 discloses a driving circuit that outputs a driving signal and a liquid discharging apparatus including the driving circuit. The driving circuit includes a modulation circuit that modulates a base driving signal and a plurality of power amplification circuits that perform power amplification on a signal output from the modulation circuit.

However, the driving circuit disclosed in JP-A-2009-166349 has a room for improvement in terms of enhancement of operation stability.

SUMMARY

According to an aspect of the present disclosure, a driving circuit that outputs a driving signal for driving a driving section includes a modulation circuit configured to modulate a base driving signal that is a base of the driving signal and output a modulation signal, an amplification circuit configured to output, from a first output point, an amplified modulation signal obtained by amplifying the modulation signal, a level shift circuit configured to output, from a second output point, a level-shift amplified modulation signal obtained by shifting a potential of the amplified modulation signal, and a demodulation circuit configured to demodulate the level-shift amplified modulation signal and output the driving signal. The amplification circuit includes a first gate driver that outputs, based on the modulation signal, a first gate signal and a second gate signal, a first transistor that has one end electrically coupled to the first output point and that operates based on the first gate signal, and a second transistor that has one end electrically coupled to the first output point and the other end to which a first power source voltage is supplied and that operates based on the second gate signal. The level shift circuit includes a second gate driver that outputs, based on the base driving signal, a third gate signal and a fourth gate signal, a third transistor that has one end electrically coupled to the second output point and the other end electrically coupled to the first output point and that operates based on the third gate signal, a fourth transistor that has one end electrically coupled to the second output point and that operates based on the fourth gate signal, a first capacitance element that has one end electrically coupled to the first output point and the other end electrically coupled to the other end of the fourth transistor, and a second capacitance element that has one end electrically coupled to the one end of the fourth transistor and the other end which is electrically coupled to the second gate driver and to which a second power source voltage is supplied. The driving signal includes a first period in which a first potential is fixed, a second period in which a second potential higher than the first potential is fixed, and a third period in which a third potential higher than the second potential is fixed. The second gate driver outputs, in the second period, the third gate signal for controlling the third transistor to be conductive and the fourth gate signal for controlling the fourth transistor to be nonconductive.

According to an aspect of the present disclosure, a liquid ejecting apparatus includes an ejection portion configured to eject liquid, and a driving circuit configured to output a driving signal for driving the ejection portion. The driving circuit includes a modulation circuit configured to modulate a base driving signal that is a base of the driving signal and output a modulation signal, an amplification circuit configured to output, from a first output point, an amplified modulation signal obtained by amplifying the modulation signal, a level shift circuit configured to output, from a second output point, a level-shift amplified modulation signal obtained by shifting a potential of the amplified modulation signal, and a demodulation circuit configured to demodulate the level-shift amplified modulation signal and output the driving signal. The amplification circuit includes a first gate driver that outputs, based on the modulation signal, a first gate signal and a second gate signal, a first transistor that has one end electrically coupled to the first output point and that operates based on the first gate signal, and a second transistor that has one end electrically coupled to the first output point and the other end to which a first power source voltage is supplied and that operates based on the second gate signal. The level shift circuit includes a second gate driver that outputs, based on the base driving signal, a third gate signal and a fourth gate signal, a third transistor that has one end electrically coupled to the second output point and the other end electrically coupled to the first output point and that operates based on the third gate signal, a fourth transistor that has one end electrically coupled to the second output point and that operates based on the fourth gate signal, a first capacitance element that has one end electrically coupled to the first output point and the other end electrically coupled to the other end of the fourth transistor, and a second capacitance element that has one end electrically coupled to the one end of the fourth transistor and the other end which is electrically coupled to the second gate driver and to which a second power source voltage is supplied. The driving signal includes a first period in which a first potential is fixed, a second period in which a second potential higher than the first potential is fixed, and a third period in which a third potential higher than the second potential is fixed. The second gate driver outputs, in the second period, the third gate signal for controlling the third transistor to be conductive and the fourth gate signal for controlling the fourth transistor to be nonconductive.

BRIEF DESCRIPTION OF THE DRAWINGS

FIGS. 8A to 8C are diagrams illustrating correction of a potential of a voltage performed in accordance with waveform correction of the driving signal.

FIGS. 9A to 9C are diagrams illustrating correction of a voltage Vc performed in accordance with a potential of the voltage VMV.

FIGS. 10A and 10B are diagrams illustrating waveform correction of the driving signal based on potentials of voltages Vb and Vt.

DESCRIPTION OF EXEMPLARY EMBODIMENTS

Hereinafter, preferred embodiments of the present disclosure will be described with reference to the accompanying drawings. The drawings are only used for sake of convenience of description. Note that the embodiments below do not unreasonably limit content of the present disclosure disclosed in the claims. It is not necessarily the case that all components described below are requirements of the present disclosure.

1. Outline of Liquid Ejecting Apparatus

Figure 1:
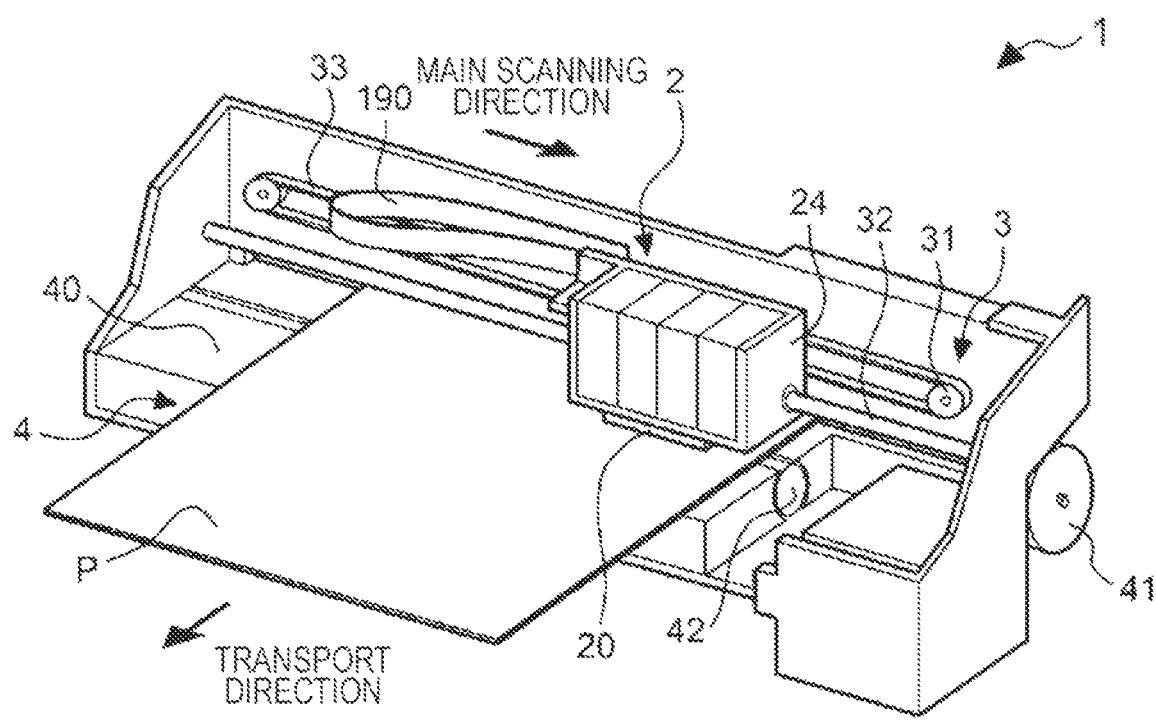
FIG. 1 is a diagram illustrating a configuration of a liquid ejecting apparatus.

FIG. 1 is a diagram illustrating a configuration of a liquid ejecting apparatus 1. As illustrated in FIG. 1, the liquid ejecting apparatus 1 includes a movement unit 3 that causes a movable body 2 to reciprocate in a main scanning direction.

The movement unit 3 includes a carriage motor 31 serving as a driving source of a movement of the movable body 2, a carriage guide shaft 32 having fixed opposite ends, and a timing belt 33 that extends substantially in parallel to the carriage guide shaft 32 and that is driven by the carriage motor 31.

The movable body 2 includes a carriage 24. The carriage 24 is supported by the carriage guide shaft 32 in a reciprocation available manner and fixed to a portion of the timing belt 33. Accordingly, the carriage motor 31 drives the timing belt 33 forward and backward so that the movable body 2 reciprocates while being guided by the carriage guide shaft 32. A head unit 20 is disposed in a portion of the movable body 2 that faces a medium P. A number of nozzles ejecting ink as liquid are located on the surface of the head unit 20 that faces the medium P. Then various control signals for controlling operations of the head unit 20 are supplied to the head unit 20 through a flexible cable 190.

The liquid ejecting apparatus 1 further includes a transport unit 4 that transports the medium P on a platen 40 in a transport direction. The transport unit 4 includes a transport motor 41 serving as a driving source of transport of the medium P and a transport roller 42 that is rotated by the transport motor 41 and that transports the medium P in the transport direction.

In the liquid ejecting apparatus 1 configured as described above, a desired image is formed on a surface of the medium P by ejecting ink on the medium P from the head unit 20 at a timing when the medium P is transported by the transport unit 4.

Figure 2:
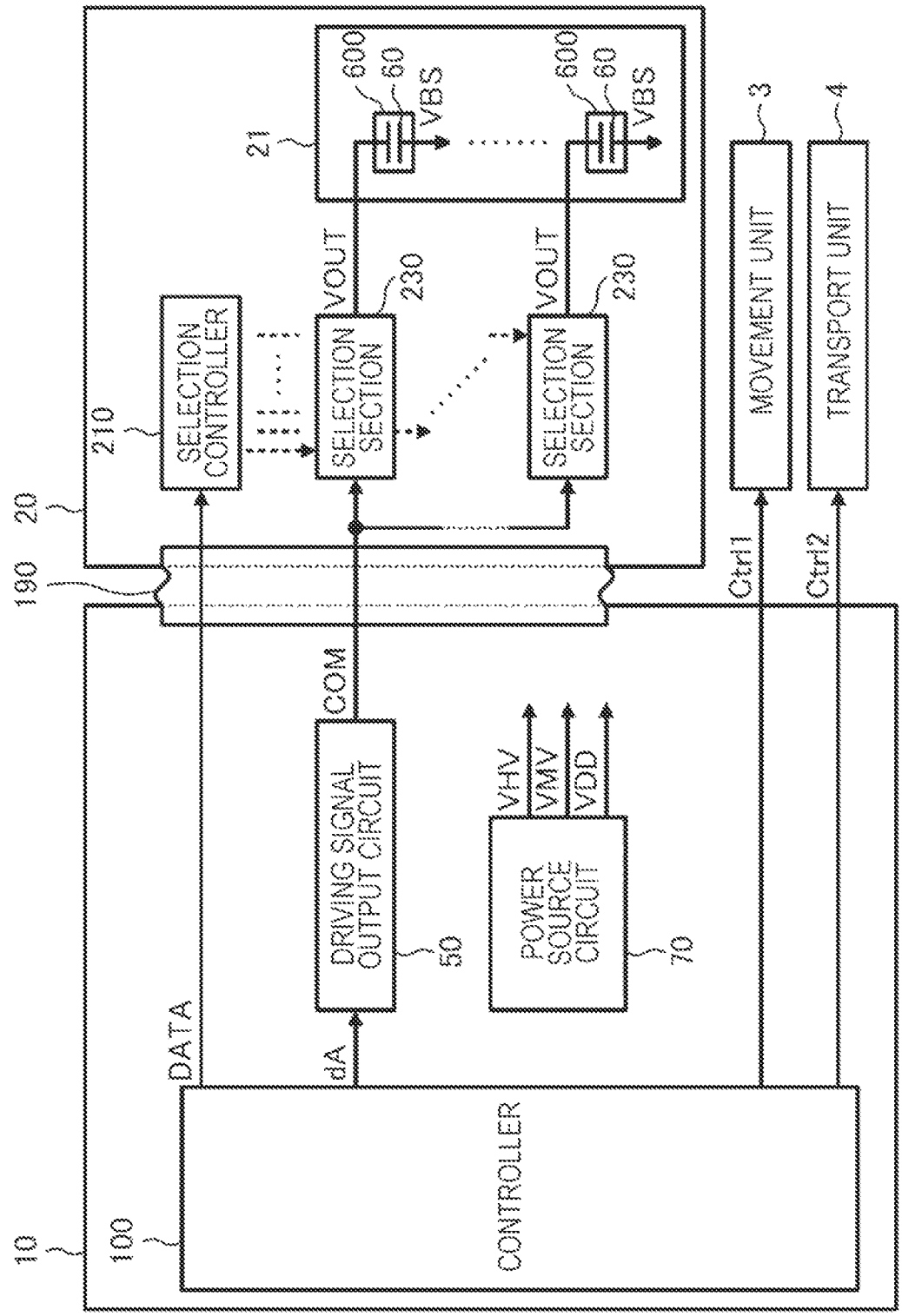
FIG. 2 is a diagram illustrating a functional configuration of the liquid ejecting apparatus.

Next, a functional configuration of the liquid ejecting apparatus 1 will be described. FIG. 2 is a diagram illustrating the functional configuration of the liquid ejecting apparatus 1. As illustrated in FIG. 2, the liquid ejecting apparatus 1 includes a control unit 10, the head unit 20, the movement unit 3, the transport unit 4, and the flexible cable 190 that electrically couples the control unit 10 and the head unit 20 to each other.

The control unit 10 includes a controller 100, a driving signal output circuit 50, and a power source circuit 70.

The power source circuit 70 generates voltages VHV, VMV, and VDD having predetermined voltage values using commercial AC power supplied from an outside of the liquid ejecting apparatus 1 and outputs the voltages VHV, VMV, and VDD to the corresponding components of the liquid ejecting apparatus 1. Here, in this embodiment, the voltage VHV is a direct current voltage of 42V, the voltage VMV is a direct current voltage of 21V, and the voltage VDD is a direct current voltage of 5V. Note that the power source circuit 70 may output signals of different voltage values instead of or in addition to the voltages VHV, VMV, and VDD. Furthermore, the power source circuit 70 may include an AC/DC converter that generates the voltage VHV using commercial AC power and a DC/DC converter that generates the voltages VMV and VDD using the voltage VHV.

Image data is supplied to the controller 100 from an external apparatus, not illustrated, installed outside the liquid ejecting apparatus 1, an example of the external apparatus being a host computer. Thereafter, the controller 100 performs various image processes on the supplied image data so as to generate various control signals for controlling the units included in the liquid ejecting apparatus 1 and output the control signals to the corresponding components.

Specifically, the controller 100 generates a control signal Ctrl1 for controlling the reciprocation of the movable body 2 performed by the movement unit 3 and outputs the generated control signal Ctrl1 to the carriage motor 31 included in the movement unit 3. Furthermore, the controller 100 generates a control signal Ctrl2 for controlling transport of the medium P performed by the transport unit 4 and outputs the generated control signal Ctrl2 to the transport motor 41 included in the transport unit 4. By this, the reciprocation of the movable body 2 in a main scanning direction and transport of the medium P in the transport direction are controlled so that the head unit 20 may eject ink to a desired position of the medium P. Note that the controller 100 may supply the control signal Ctrl1 to the movement unit 3 through a carriage motor driver not illustrated, or may supply the control signal Ctrl2 to the transport unit 4 through a transport motor driver not illustrated.

Furthermore, the controller 100 outputs base driving data dA to the driving signal output circuit 50. Here, the base driving data dA is a digital signal including data for specifying a waveform of a driving signal COM to be supplied to the head unit 20. Then the driving signal output circuit 50 converts the supplied base driving data dA into an analog signal before generating the driving signal COM by amplifying the converted signal and supplying the driving signal COM to the head unit 20. Note that a configuration and operation of the driving signal output circuit 50 will be described hereinafter in detail.

Furthermore, the controller 100 generates a driving data signal DATA for controlling an operation of the head unit 20 and outputs the driving data signal DATA to the head unit 20.

The head unit 20 includes a selection controller 210, a plurality of selection sections 230, and an ejection head 21. Furthermore, the ejection head 21 includes a plurality of ejection portions 600 including corresponding piezoelectric elements 60. Here, the plurality of selection sections 230 are disposed so as to correspond to the respective piezoelectric elements 60 included in the corresponding ejecting portions 600 included in the ejection head 21.

The driving data signal DATA is input to the selection controller 210. The selection controller 210 generates selection control signals indicating whether the driving signal COM is to be selected or not to be selected for the respective selection sections 230 based on the supplied driving data signal DATA and outputs the generated selection control signals to the respective selection sections 230. Each of the plurality of selection sections 230 selects or does not select the driving signal COM as a driving signal VOUT based on the supplied selection control signal. By this, each of the selection sections 230 generates a driving signal VOUT based on the driving signal COM and supplies the driving signal VOUT to one end of a corresponding one of the piezoelectric elements 60 included in the corresponding ejection portions 600 included in the ejection head 21. Furthermore, a reference voltage signal VBS serving as a reference for driving the piezoelectric element 60 is supplied to the other end of the piezoelectric element 60. Note that the reference voltage signal VBS may be a signal having a DC voltage of 5V or having a ground potential.

The piezoelectric elements 60 are disposed so as to correspond to a plurality of nozzles included in the head unit 20. Then each of the piezoelectric elements 60 is driven in accordance with a potential difference between the driving signal VOUT supplied to the one end and the reference voltage signal VBS supplied to the other end so that ink is ejected from a corresponding one of the nozzles.

Note that, although the head unit 20 has the one ejection head 21 in FIG. 2, the liquid ejecting apparatus 1 may include a plurality of ejection heads 21 corresponding to the number of types of ink to be ejected or the like.

2. Configuration of Ejection Portions

Figure 3:
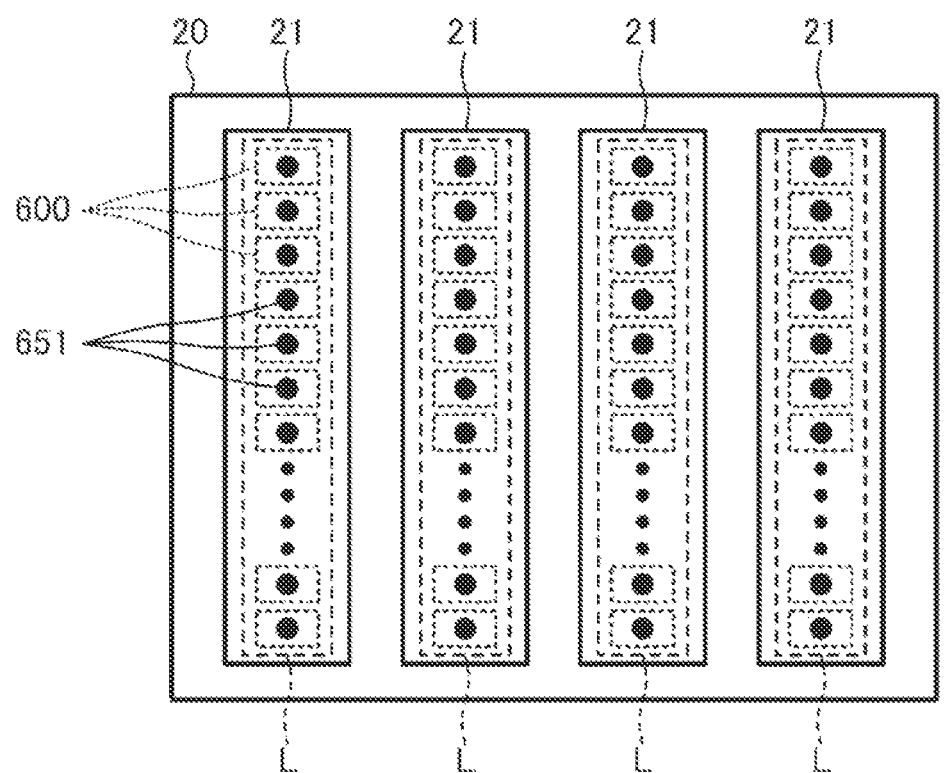
FIG. 3 is a diagram illustrating an example of arrangement of a plurality of ejection portions in a head unit.

FIG. 3 is a diagram illustrating an example of arrangement of the plurality of ejection portions 600 in the head unit 20. Note that, in FIG. 3, the head unit 20 includes four ejection heads 21, for example.

As illustrated in FIG. 3, each of the ejection heads 21 includes the plurality of ejection portions 600 disposed in a line in one direction. Specifically, in the head unit 20, the number of nozzle lines L that correspond to the number of ejection heads 21 and that include nozzles 651 accommodated in the corresponding ejection portions 600 and arranged in one direction are formed. Note that the arrangement of the nozzles 651 in the nozzle lines L included in the ejection heads 21 is not limited to a line, and each of the ejection heads 21 may have a nozzle line L configured such that the plurality of nozzles 651 are divided into even-numbered nozzles 651 and odd-numbered nozzles 651 counted from one end and the even-numbered nozzles 651 and the odd-numbered nozzles 651 are disposed in shifted positions in a zigzag manner, or a nozzle line L having a plurality of nozzles 651 arranged in two or more lines in parallel.

Figure 4:
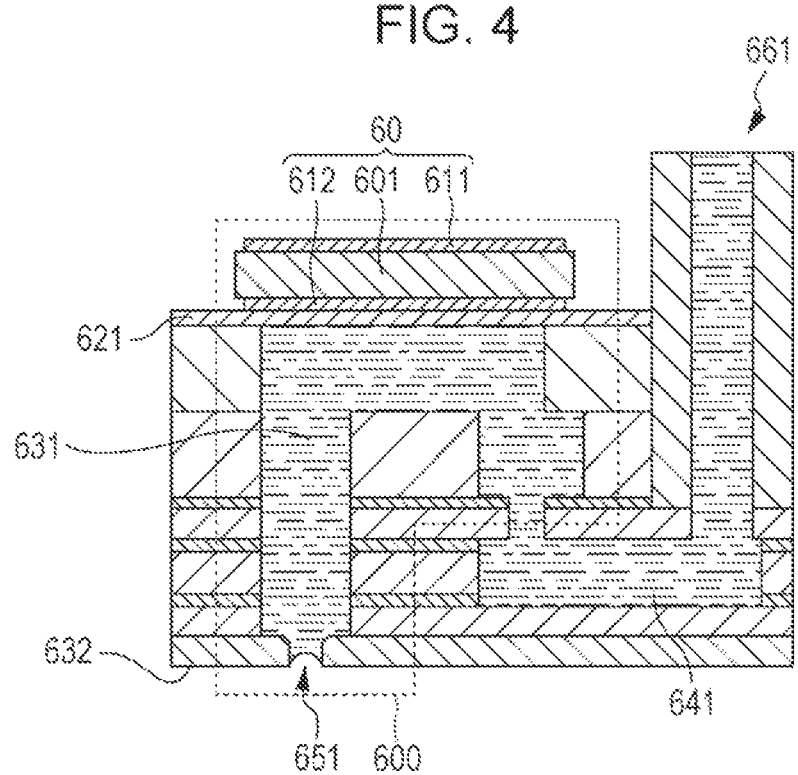
FIG. 4 is a diagram schematically illustrating a configuration of one of the ejection portions.

Here, an example of a configuration of the ejection portions 600 will be described. FIG. 4 is a diagram schematically illustrating a configuration of one of the ejection portions 600. As illustrated in FIG. 4, the ejection portion 600 includes a piezoelectric element 60, a vibration plate 621, a cavity 631, and a nozzle 651. The cavity 631 is filled with ink supplied from a reservoir 641. The ink is guided from an ink cartridge not illustrated through a supply port 661 to the reservoir 641. Specifically, the cavity 631 is filled with the ink stored in the corresponding ink cartridge.

The vibration plate 621 is displaced by driving of the piezoelectric element 60 disposed on an upper surface thereof as illustrated in FIG. 4. Then internal volume of the cavity 631 filled with the ink is increased or reduced in accordance with the displacement of the vibration plate 621. Specifically, the vibration plate 621 functions as a diaphragm for changing the internal volume of the cavity 631. The nozzle 651 is an opening portion formed in a nozzle plate 632 and communicates with the cavity 631. When the internal volume of the cavity 631 is changed, an amount of ink corresponding to the change in the internal volume is guided to the cavity 631 and ejected from the nozzle 651.

The piezoelectric element 60 is configured such that a piezoelectric body 601 is sandwiched between a pair of electrodes 611 and 612. In the piezoelectric element 60 configured as described above, center portions of the electrodes 611 and 612 bend in an up-down direction with the vibration plate 621 in accordance with a potential difference between voltages supplied from the electrodes 611 and 612. Specifically, a driving signal VOUT is supplied to the electrode 611 of the piezoelectric element 60 and a signal of a reference potential is supplied to the electrode 612 of the piezoelectric element 60. When a voltage level of the driving signal VOUT supplied to the electrode 611 is lowered, a corresponding one of the piezoelectric elements 60 bends upward whereas when the voltage level of the driving signal VOUT supplied to the electrode 611 is increased, a corresponding piezoelectric element 60 bends downward.

In the ejection portion 600 configured as described above, when the piezoelectric element 60 bends upward, the vibration plate 621 is displaced upward and the internal volume of the cavity 631 is increased. By this, the ink is drawn from the reservoir 641. On the other hand, when the piezoelectric element 60 bends downward, the vibration plate 621 is displaced downward and the internal volume of the cavity 631 is reduced. By this, an amount of ink corresponding to a degree of the reduction is ejected from the nozzle 651. Note that the configuration of the piezoelectric element 60 is not limited to that illustrated in FIG. 4 as long as the ink is ejected from the nozzle 651 when the piezoelectric element 60 is driven. Furthermore, the configuration of the piezoelectric element 60 is not limited to that of the bending vibration described above, and a configuration using a vertical vibration may be used. Furthermore, in the piezoelectric element 60, when a voltage level of the driving signal VOUT supplied to the electrode 611 is increased, the corresponding piezoelectric element 60 may bend upward whereas when the voltage level of the driving signal VOUT supplied to the electrode 611 is reduced, a corresponding one of the piezoelectric elements 60 may bend downward.

Here, each of the ejection portions 600 including the piezoelectric elements 60 is an example of a driving section, and the driving signal COM serving as a base of the driving signal VOUT for driving the driving section is an example of a driving signal. Note that, since the driving signal VOUT is generated when the driving signal COM is selected or not selected, the driving signal VOUT is also an example of the driving signal in a broad sense.

3. Configuration of Driving Signal Output Circuit

As described above, the piezoelectric elements 60 is driven, by the driving signal VOUT based on the driving signal COM generated by the driving signal output circuit 50, for ejection of ink performed by the ejection portions

600 included in the head unit 20. A configuration and operation of the driving signal output circuit 50 that generates the driving signal COM that is a base of the driving signal VOUT will be described.

3.1 Voltage Waveform of Driving Signal COM

Figure 5:
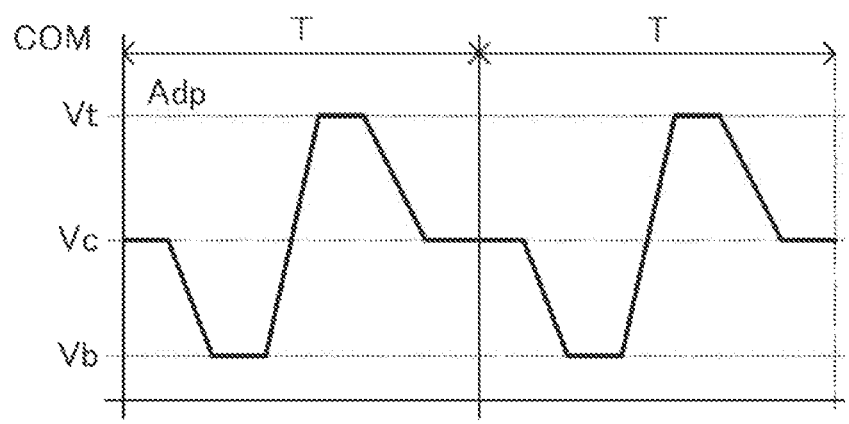
FIG. 5 is a diagram illustrating an example of a waveform of a driving signal.

An example of a waveform of the driving signal COM generated by the driving signal output circuit 50 will now be described. FIG. 5 is a diagram illustrating an example of a waveform of the driving signal COM. As illustrated in FIG. 5, the driving signal COM includes a trapezoidal waveform Adp in every cycle T. A trapezoidal waveform Adp included in the driving signal COM includes a period of time in which a voltage Vc is fixed, a period of time in which a voltage Vb having a lower potential than that of the voltage Vc is fixed and which follows the period of time in which the voltage Vc is fixed, a period of time in which a voltage Vt having a potential higher than that of the voltage Vc is fixed and which follows the period of time in which the voltage Vb is fixed, and a period of time in which the voltage Vc is fixed and which follows the period of time in which the voltage Vt is fixed. Specifically, the driving signal COM includes the trapezoidal waveform Adp that starts with the voltage Vc and terminates with the voltage Vc. In other words, the driving signal COM includes a period of time in which a potential is fixed in the voltage Vb, a period of time in which a potential is fixed in the voltage Vc having a potential higher than that of the voltage Vb, and a period of time in which a potential is fixed in the voltage Vt having a potential higher than that of the voltage Vc. Here, the voltage Vb and a potential of the voltage Vb are examples of a first potential, the voltage Vc and a potential of the voltage Vc are examples of a second potential, and the voltage Vt and a potential of the voltage Vt are examples of a third potential.

Here, the voltage Vc functions as a reference potential serving as a reference of the displacement of the piezoelectric element 60 driven by the driving signal COM. The piezoelectric element 60 bends upward in FIG. 4 when a voltage value of the driving signal COM supplied to the piezoelectric element 60 becomes the voltage Vb from the voltage Vc, and as a result, the vibration plate 621 is displaced upward in FIG. 4. Thereafter, when the vibration plate 621 is displaced upward, the internal volume of the cavity 631 is increased and the ink is drawn into the cavity 631 from the reservoir 641. Thereafter, the piezoelectric element 60 bends downward in FIG. 4 when the voltage value of the driving signal COM supplied to the piezoelectric element 60 becomes the voltage Vt from the voltage Vb, and as a result, the vibration plate 621 is displaced downward in FIG. 4. When the vibration 621 is displaced downward, the internal volume of the cavity 631 is reduced and the ink stored in the cavity 631 is ejected from the nozzle 651. Furthermore, after the ink is ejected from the nozzle 651 by driving of the piezoelectric element 60, the ink in the vicinity of the nozzle 651 and the vibration plate 621 may be continuously vibrated for a certain period of time. The period of time in which the voltage Vc is fixed included in the driving signal COM also functions as a period of time for stopping such vibration generated in the ink and the vibration plate 621 that does not contribute to the ejection of the ink.

3.2 Configuration of Driving Signal Output Circuit

Figure 6A:
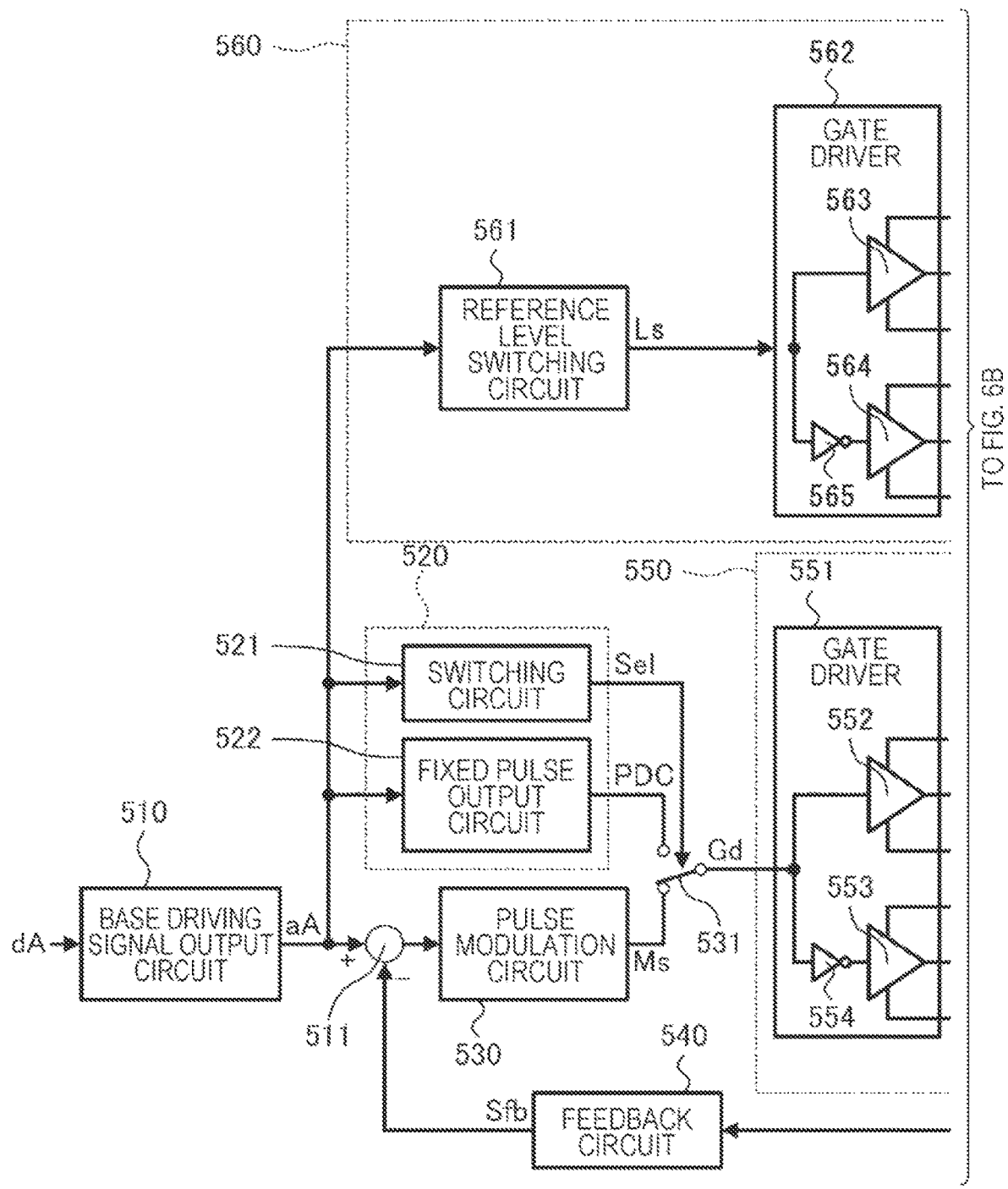
FIGS. 6A and 6B are diagrams illustrating a functional configuration of a driving signal output circuit.
Figure 6B:
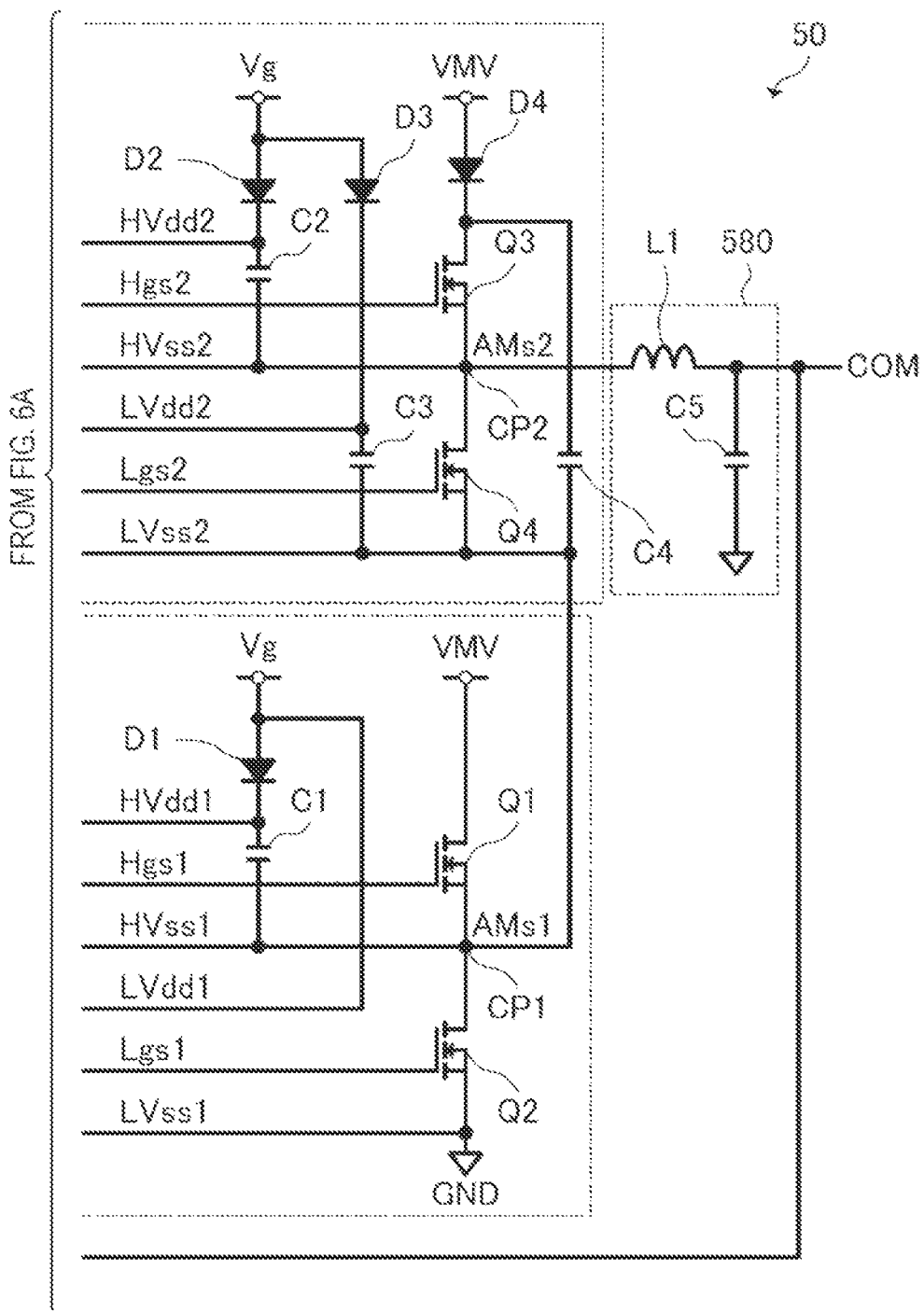

A configuration of the driving signal output circuit 50 that generates and outputs the driving signal COM will now be described. FIGS. 6A and 6B are diagrams illustrating a functional configuration of the driving signal output circuit 50. As illustrated in FIGS. 6A and 6B, the driving signal output circuit 50 includes a base driving signal output circuit 510, an adder 511, a fixed output switching circuit 520, a pulse modulation circuit 530, a switch 531, a feedback circuit 540, a digital amplification circuit 550, a level shift circuit 560, and a demodulation circuit 580.

The controller 100 supplies base driving data dA that is a digital signal to the base driving signal output circuit 510. The base driving signal output circuit 510 performs digital-analog conversion on the supplied base driving data dA, and thereafter, outputs the converted analog signal as a base driving signal aA. Specifically, the base driving signal output circuit 510 includes a digital-to-analog (D/A) converter. A voltage amplitude of the base driving signal aA is 1 to 2 V, for example, and the driving signal output circuit 50 outputs the amplified base driving signal aA as the driving signal COM. Specifically, the base driving signal aA corresponds to a target signal before the amplification of the driving signal COM.

The base driving signal aA is supplied to a positive input terminal of the adder 511, and a feedback signal Sfb of the driving signal COM is supplied through the feedback circuit 540 to a negative input terminal of the adder 511. Then the adder 511 outputs a voltage obtained by subtracting a voltage input to the negative input terminal from a voltage input to the positive input terminal and integrating a result thereof to the pulse modulation circuit 530.

The pulse modulation circuit 530 performs pulse modulation on the signal supplied from the adder 511 and outputs the modulated signal to the switch 531. Specifically, the pulse modulation circuit 530 modulates the base driving signal aA serving as a base of the driving signal COM so as to output a modulated signal Ms.

The fixed output switching circuit 520 includes a switching circuit 521 and a fixed pulse output circuit 522. The base driving signal aA is supplied to the fixed pulse output circuit 522. Then the fixed pulse output circuit 522 generates a pulse signal PDC of a predetermined duty corresponding to a potential of the input base driving signal aA and outputs the pulse signal PDC to the switch 531. Furthermore, the base driving signal aA is supplied to the switching circuit 521. Then the switching circuit 521 outputs a switch signal Sel for controlling the switch 531 based on a potential of the input base driving signal aA. Specifically, the switching circuit 521 outputs the switch signal Sel to be used by the switch 531 to output the modulated signal Ms as a base gate signal Gd from an output terminal in a period of time in which the potential of the base driving signal aA is fixed. Furthermore, the switching circuit 521 outputs the switch signal Sel used by the switch 531 to output the pulse signal PDC as the base gate signal Gd from the output terminal in a period of time in which the potential of the base driving signal aA is changed.

The modulation signal Ms is supplied to one input terminal of the switch 531 and the pulse signal PDC is supplied to the other input terminal of the switch 531. Then the switch 531 selects the modulation signal Ms to be output as the base gate signal Gd from the output terminal or the pulse signal PDC to be output as the base gate signal Gd from the output terminal, based on the switch signal Sel output from the switching circuit 521. The base gate signal Gd output from the switch 531 is supplied to the digital amplification circuit 550.

The digital amplification circuit 550 includes a gate driver 551, a diode D1, a capacitor C1, and transistors Q1 and Q2. The digital amplification circuit 550 outputs an amplified modulation signal AMs1 obtained by amplifying the base gate signal Gd from a midpoint CP1.

Specifically, the base gate signal Gd is supplied to the gate driver 551 included in the digital amplification circuit 550. The gate driver 551 outputs a gate signal Hgs1 for driving the transistor Q1 and a gate signal Lgs1 for driving the transistor Q2 based on a logical level of the supplied base gate signal Gd.

The transistors Q1 and Q2 are configured by an N-channel MOS-FET. The gate signal Hgs1 output from the gate driver 551 is supplied to a gate terminal of the transistor Q1. Furthermore, a voltage VMV is supplied to a drain terminal of the transistor Q1, and a source terminal of the transistor Q1 is coupled to the midpoint CP1. Specifically, the transistor Q1 has the source terminal serving as one end electrically coupled to the midpoint CP1 and operates based on the gate signal Hgs1. Furthermore, the gate signal Hgs2 output from the gate driver 551 is supplied to a gate terminal of the transistor Q2. Furthermore, a drain terminal of the transistor Q2 is coupled to the midpoint CP1, and a ground potential GND is supplied to a source terminal of the transistor Q2. Specifically, the transistor Q2 has the drain terminal serving as one end electrically coupled to the midpoint CP1 and operates based on the gate signal Lgs1. Then the digital amplification circuit 550 outputs a signal generated at the midpoint CP1 where the transistors Q1 and Q2 are coupled to each other as the amplified modulation signal AMs1.

Here, an operation of the gate driver 551 that outputs the gate signals Hgs1 and Lgs1 will be described. The gate driver 551 includes gate drive circuits 552 and 553 and an inverter circuit 554. Then the base gate signal Gd supplied to the gate driver 551 is further supplied to the gate drive circuit 552 and also supplied to the gate drive circuit 553 through the inverter circuit 554. Specifically, the signal supplied to the gate drive circuit 552 and the signal supplied to the gate drive circuit 553 are exclusively in a high level. Here, the signal exclusively in a high level means that signals in a high level are not simultaneously supplied to the gate drive circuits 552 and 553. Specifically, a state in which signals in a low level are simultaneously supplied to the gate drive circuits 552 and 553 is not excluded.

A low-potential-side input terminal of the gate drive circuit 552 is coupled to the midpoint CP1. Accordingly, a signal of a potential in the midpoint CP1 is supplied as a voltage HVss1 to the low-potential-side input terminal of the gate drive circuit 552. Furthermore, a high-potential-side input terminal of the gate drive circuit 552 is coupled to a cathode terminal of the diode D1 having an anode terminal to which a voltage Vg is supplied and also coupled to one end of the capacitor C1. The other end of the capacitor C1 is coupled to the midpoint CP1. Specifically, a bootstrap circuit including the capacitor C1 functioning as a bootstrap capacitor is configured at the high-potential-side input terminal of the gate drive circuit 552. Therefore, a voltage HVdd1 having a potential larger by the voltage Vg than a voltage HVss1 supplied to the low-potential-side input terminal is supplied to the high-potential-side input terminal of the gate drive circuit 552. Accordingly, when the base gate signal Gd in a high level is supplied to the gate drive circuit 552, the gate drive circuit 552 outputs a gate signal Hgs1 in a high level having a potential based on a voltage HVdd1 that is larger by a voltage Vg than the potential of the midpoint CP1, whereas when the base gate signal Gd in a low level is supplied to the gate drive circuit 552, the gate drive circuit 552 outputs a gate signal Hgs1 in a low level of a potential based on the voltage HVss1 that is a potential of the midpoint CP1. Note that the voltage Vg is a DC voltage generated by dropping or rising the voltages VHV, VMV, and VDD output from the power source circuit 70 and is a voltage value enabling driving of each of the transistors Q1 to Q4, that is, a DC voltage of 7.5 V, for example.

A signal of the ground potential GND is supplied as a voltage LVss1 to the low-potential-side input terminal of the gate drive circuit 553. Furthermore, the voltage Vg is supplied as a voltage LVdd1 to the high-potential-side input terminal of the gate drive circuit 553. Accordingly, when a signal in a high level obtained by inverting a logic of the base gate signal Gd in a low level by the inverter circuit 554 is supplied to the gate drive circuit 553, the gate drive circuit 553 outputs a gate signal Lgs1 in a high level having a potential based on the voltage LVdd1 corresponding to the voltage Vg, whereas when a signal in a low level obtained by inverting a logic of the base gate signal Gd in a high level by the inverter circuit 554 is supplied to the gate drive circuit 553, the gate drive circuit 553 outputs a gate signal Lgs1 in a low level of a potential based on the voltage LVss1 that is the ground potential GND.

The level shift circuit 560 includes a reference level switching circuit 561, a gate driver 562, diodes D2 to D4, capacitors C2 to C4, and transistors Q3 and Q4. Furthermore, the level shift circuit 560 outputs an level-shift amplified modulation signal AMs2 obtained by shifting the reference potential of the amplified modulation signal AMs1 from the midpoint CP2.

Specifically, the base driving signal aA is supplied to the reference level switching circuit 561 included in the level shift circuit 560 from the base driving signal output circuit 510. The reference level switching circuit 561 generates the level switching signal Ls based on the base driving signal aA and outputs the generated level switching signal Ls to the gate driver 562. Specifically, the reference level switching circuit 561 generates, when the potential of the base driving signal aA is equal to or larger than a threshold voltage Vth1 of a certain potential, the level switching signal Ls in a high level to be output to the gate driver 562 and generates, when the potential of the base driving signal aA is smaller than the threshold voltage Vth1, the level switching signal Ls in a low level to be output to the gate driver 562.

The gate driver 562 outputs a gate signal Hgs2 for driving the transistor Q3 and a gate signal Lgs2 for driving the transistor Q4 based on a logical level of the supplied level switching signal Ls.

The transistors Q3 and Q4 are configured by an N-channel MOS-FET. The gate signal Hgs2 output from the gate driver 562 is supplied to a gate terminal of the transistor Q3. Furthermore, a drain terminal of the transistor Q3 is coupled to a cathode terminal of the diode D4 having an anode terminal to which the voltage VMV is supplied, and a source terminal of the transistor Q3 is coupled to a midpoint CP2. Specifically, the transistor Q3 has the source terminal serving as one end electrically coupled to the midpoint CP2 and the drain terminal serving as the other end to which the voltage VMV is supplied through the diode D4, and operates based on the gate signal Hgs2. Furthermore, the gate signal Lgs2 output from the gate driver 562 is supplied to a gate terminal of the transistor Q4. Furthermore, a drain terminal of the transistor Q4 is coupled to the midpoint CP2, and a source terminal of the transistor Q4 is coupled to the midpoint CP1. Specifically, the transistor Q4 has the drain terminal serving as one end electrically coupled to the midpoint CP2 and the source terminal serving as the other end electrically coupled to the midpoint CP1, and operates based on the gate signal Lgs2. Then the level shift circuit 560 outputs a signal generated at the midpoint CP2 where the transistors Q3 and Q4 are coupled to each other as the level-shift amplified modulation signal AMs2.

Furthermore, the capacitor C4 has one end electrically coupled to the midpoint CP1 and the other end electrically coupled to a drain terminal of the transistor Q3. Specifically, the capacitor C4 functions as a bootstrap capacitor. Accordingly, a potential of the drain terminal of the transistor Q3 is specified based on a potential of the amplified modulation signal AMs1 output from the digital amplification circuit 550.

Here, an operation of the gate driver 562 that outputs the gate signals Hgs2 and Lgs2 will be described. The gate driver 562 includes gate drive circuits 563 and 564 and an inverter circuit 565. Then the level switching signal Ls that is supplied to the gate driver 562 and that is based on the base driving signal aA is further supplied to the gate drive circuit 563 and also supplied to the gate drive circuit 564 through the inverter circuit 565. Specifically, the signal supplied to the gate drive circuit 563 and the signal supplied to the gate drive circuit 564 are exclusively in a high level. Here, the signal exclusively in a high level means that signals in a high level are not simultaneously supplied to the gate drive circuits 563 and 564. Specifically, a state in which signals in a low level are simultaneously supplied to the gate drive circuits 563 and 564 is not excluded.

A low-potential-side input terminal of the gate drive circuit 563 is coupled to the midpoint CP2. Accordingly, a signal of a potential in the midpoint CP2 is supplied as a voltage HVss2 to the low-potential-side input terminal of the gate drive circuit 563. Furthermore, a high-potential-side input terminal of the gate drive circuit 563 is coupled to a cathode terminal of the diode D2 having an anode terminal to which a voltage Vg is supplied. The capacitor C2 has one end coupled to the midpoint CP2 and the other end coupled to the cathode terminal of the diode D2. Accordingly, one end of the capacitor C2 is coupled to a source terminal of the transistor Q3, and the other end of the capacitor C2 is electrically coupled to the gate driver 562 including the gate drive circuit 563. The voltage Vg is supplied to the other end of the capacitor C2 through the diode D2.

Specifically, a bootstrap circuit including the capacitor C2 functioning as a bootstrap capacitor is configured at the high-potential-side input terminal of the gate drive circuit 563. Therefore, a voltage HVdd2 having a potential larger by the voltage Vg than a voltage HVss2 supplied to the low-potential-side input terminal is supplied to the high-potential-side input terminal of the gate drive circuit 563. Accordingly, when the level switching signal Ls in a high level is supplied to the gate drive circuit 563, the gate drive circuit 563 outputs a gate signal Hgs2 in a high level having a potential based on the voltage HVdd2 that is larger by the voltage Vg than the potential of the midpoint CP2, whereas when the level switching signal Ls in a low level is supplied to the gate drive circuit 563, the gate drive circuit 563 outputs a gate signal Hgs2 in a low level of a potential based on the voltage HVss2 that is a potential of the midpoint CP2.

A low-potential-side input terminal of the gate drive circuit 564 is coupled to the midpoint CP1. Accordingly, a signal of a potential of the midpoint CP1 is supplied as a voltage LVss2 to the low-potential-side input terminal of the gate drive circuit 564. Furthermore, a high-potential-side input terminal of the gate drive circuit 564 is coupled to a cathode terminal of the diode D3 having an anode terminal to which a voltage Vg is supplied and also coupled to one end of the capacitor C3. The other end of the capacitor C3 is coupled to the midpoint CP1. Specifically, a bootstrap circuit including the capacitor C3 functioning as a bootstrap capacitor is configured at the high-potential-side input terminal of the gate drive circuit 564. Therefore, a voltage LVdd2 having a potential larger by the voltage Vg than the voltage LVss2 supplied to the low-potential-side input terminal is supplied to the high-potential-side input terminal of the gate drive circuit 564. Accordingly, when a signal in a high level obtained by inverting a logic of the level switching signal Ls in a low level by the inverter circuit 565 is supplied to the gate drive circuit 564, the gate drive circuit 564 outputs a gate signal Lgs2 in a high level having a potential based on the voltage LVdd2 that is larger by the voltage Vg than the potential of the midpoint CP1, whereas when a signal in a low level obtained by inverting a logic of the level switching signal Ls in a high level by the inverter circuit 565 is supplied to the gate drive circuit 564, the gate drive circuit 563 outputs a gate signal Lgs2 in a low level of a potential based on the voltage LVss2 that is a potential of the midpoint CP1.

The demodulation circuit 580 outputs the driving signal COM that has been demodulated by smoothing the level-shift amplified modulation signal AMs2 output from the level shift circuit 560. The demodulation circuit 580 includes an inductor L1 and a capacitor C5. The inductor L1 has one end electrically coupled to the midpoint CP2 and the other end electrically coupled to one end of the capacitor C5. The ground potential GND is supplied to the other end of the capacitor C5. Specifically, the inductor L1 and the capacitor C5 configure a low-pass filter circuit. Accordingly, the level-shift amplified modulation signal AMs2 output from the level shift circuit 560 is smoothed, and a smoothed voltage is output as the driving signal COM from the driving signal output circuit 50.

The feedback circuit 540 is electrically coupled to the pulse modulation circuit 530 and the demodulation circuit 580 and supplies a feedback signal Sfb obtained by attenuating the driving signal COM generated by the demodulation circuit 580 to the adder 511. Specifically, the driving signal output circuit 50 includes the feedback circuit 540 that is electrically coupled to the pulse modulation circuit 530 and the demodulation circuit 580 and that outputs the feedback signal Sfb based on the driving signal COM. Accordingly, the driving signal COM output from the demodulation circuit 580 is fed back to the pulse modulation circuit 530, and as a result, accuracy of the driving signal COM is improved.

Here, the pulse modulation circuit 530 is an example of a modulation circuit. Furthermore, the digital amplification circuit 550 is an example of an amplification circuit, and the midpoint CP1 that outputs the amplified modulation signal AMs1 from the digital amplification circuit 550 is an example of a first output point. Furthermore, the midpoint CP2 that outputs the level-shift amplified modulation signal AMs2 from the level shift circuit 560 is an example of a second output point. Moreover, the gate driver 551 included in the digital amplification circuit 550 is an example of a first gate driver, the gate signal Lgs1 output from the gate driver 551 is an example of a first gate signal, and the gate signal Hgs1 output from the gate driver 551 is an example of a second gate signal. The transistor Q2 that operates based on the gate signal Lgs1 is an example of a first transistor, and the transistor Q1 that operates based on the gate signal Hgs1 is an example of a second transistor. Moreover, the gate driver 562 included in the level shift circuit 560 is an example of a second gate driver, the gate signal Lgs2 output from the gate driver 562 is an example of a third gate signal, and the gate signal Hgs2 output from the gate driver 562 is an example of a fourth gate signal. The transistor Q4 that operates based on the gate signal Lgs2 is an example of a third transistor, and the transistor Q3 that operates based on the gate signal Hgs2 is an example of a fourth transistor. Furthermore, the capacitor C4 is an example of a first capacitance element, and the capacitor C2 is an example of a second capacitance element. The voltage VMV supplied to the transistor Q1 is an example of a first power source voltage, the voltage Vg supplied to the capacitor C2 through the diode D2 is an example of a second power source voltage.

3.3 Operation of Driving Signal Output Circuit

Figure 7:
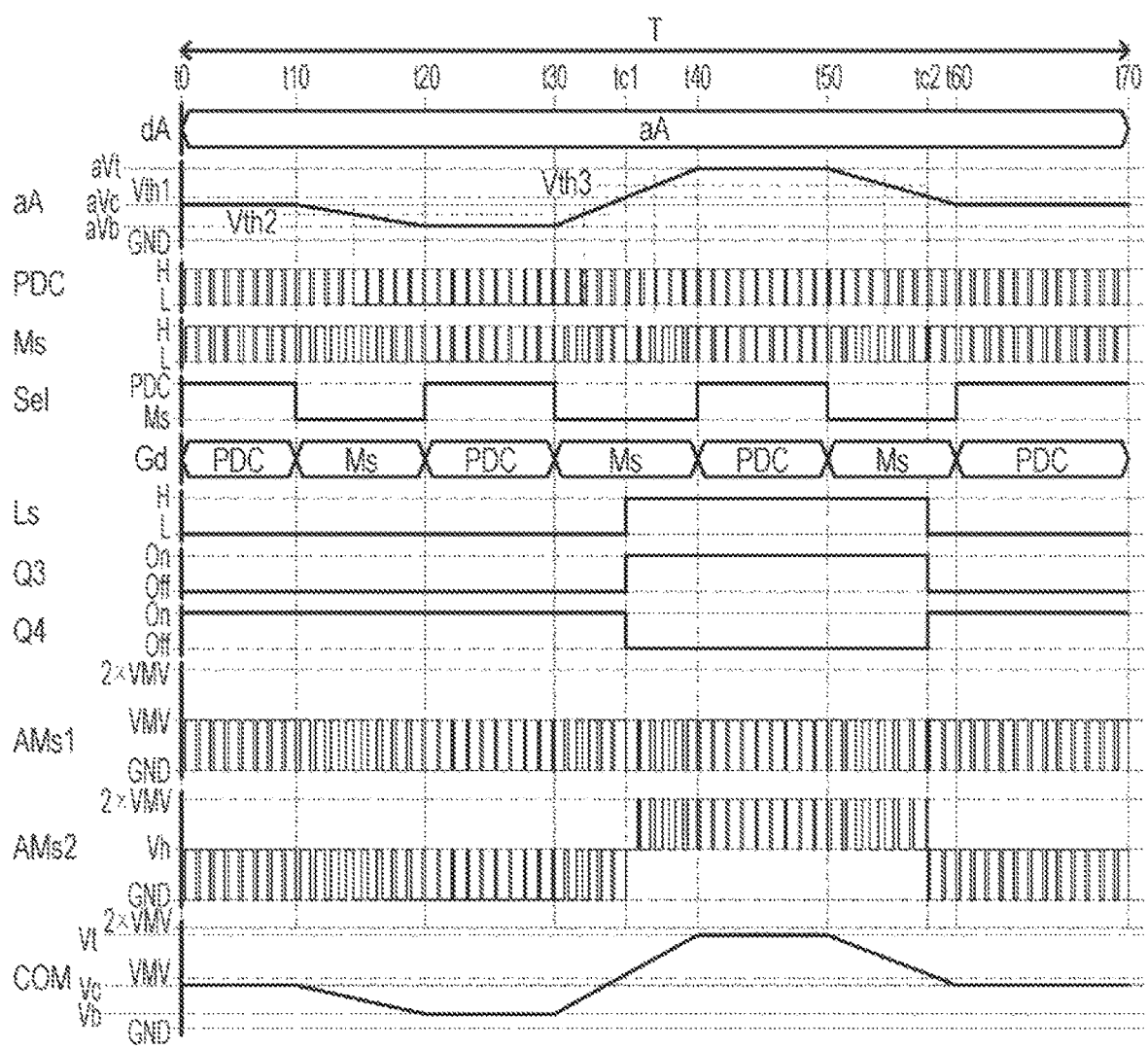
FIG. 7 is a diagram illustrating an operation of the driving signal output circuit.

An operation of generating the driving signal COM performed by the driving signal output circuit 50 configured as described above will be described. FIG. 7 is a diagram illustrating the operation of the driving signal output circuit 50. Note that, in FIG. 7, only a driving signal COM in an arbitrary cycle T in driving signals COM output from the driving signal output circuit 50 is illustrated.

Here, it is assumed in FIG. 7 that the threshold voltage Vth1 having a potential for performing switching between output of the level switching signal Ls in a high level performed by the reference level switch circuit 561 and output of the level switching signal Ls in a low level performed by the reference level switching circuit 561 has a potential larger than a voltage aVc obtained before the voltage Vc is amplified.

Furthermore, it is assumed that the fixed pulse output circuit 522 outputs a pulse signal PDC constantly having a pulse width of first Duty when a potential of the base driving signal aA is smaller than a threshold voltage Vth2, outputs a pulse signal PDC constantly having a pulse width of second Duty when a potential of the base driving signal aA is in a range between the threshold voltage Vth2 and a threshold voltage Vth3, and outputs a pulse signal PDC constantly having a pulse width of third Duty when a potential of the base driving signal aA is larger than the threshold voltage Vth3. Here, it is assumed that a potential of the threshold voltage Vth2 is lower than a voltage aVc obtained before the voltage Vc is amplified and higher than a voltage aVb obtained before the voltage Vb is amplified. Furthermore, it is assumed that a potential of the threshold voltage Vth3 is higher than the voltage aVc obtained before the voltage Vc is amplified and lower than a voltage aVt obtained before the voltage Vt is amplified. Specifically, the fixed pulse output circuit 522 outputs a pulse signal PDC constantly having a pulse width of the first Duty in a period of time in which a potential of the base driving signal aA that is a base of the driving signal COM is fixed to the voltage aVb, outputs a pulse signal PDC having a pulse width of the second Duty in a period of time in which a potential of the base driving signal aA is fixed to the voltage aVc, and outputs a pulse signal PDC having a pulse width of the third Duty in a period of time in which a potential of the base driving signal aA that is a base of the driving signal COM is fixed to the voltage aVt.

As illustrated in FIG. 7, in a period from a time point t0 to a time point t10, the driving signal output circuit 50 outputs a driving signal COM constantly having a voltage value of the voltage Vc. Specifically, in the period from the time point t0 to the time point t10, the base driving data dA for generating a driving signal COM constantly having a voltage value of the voltage Vc is supplied to the base driving signal output circuit 510. The base driving signal output circuit 510 generates a base driving signal aA constantly having a voltage aVc based on the supplied base driving data dA. The base driving signal aA generated by the base driving signal output circuit 510 is supplied to the pulse modulation circuit 530 through the adder 511, and in addition, supplied to the switching circuit 521 and the fixed pulse output circuit 522 included in the fixed output switching circuit 520.

Furthermore, since the voltage value of the supplied base driving signal aA is fixed to the voltage aVc in the period from the time point t0 to the time point t10, the switching circuit 521 outputs a switch signal Sel to be used by the switch 531 to select the pulse signal PDC as a base gate signal Gd. Consequently, the pulse signal PDC constantly having a pulse width of the second Duty output from the fixed pulse output circuit 522 is supplied as the base gate signal Gd to the digital amplification circuit 550. Then the gate driver 551 included in the digital amplification circuit 550 outputs the gate signal Hgs1 corresponding to a logical level of the supplied base gate signal Gd and the gate signal Lgs1 corresponding to a signal obtained by inverting the logical level of the base gate signal Gd, so as to output an amplified modulation signal AMs1 obtained by amplifying the base gate signal Gd based on the voltage VMV to the midpoint CP1 of the digital amplification circuit 550.

Furthermore, the base driving signal aA is also supplied to the reference level switching circuit 561 included in the level shift circuit 560. In the period from the time point t0 to the time point t10, since a potential of the base driving signal aA is lower than the threshold voltage Vth1, the reference level switching circuit 561 outputs the level switching signal Ls in a low level to the gate driver 562. Accordingly, the gate driver 562 outputs the gate signal Hgs2 in a low level to the transistor Q3 and the gate signal Lgs2 in a high level to the transistor Q4. As a result, the transistor Q3 is controlled to be nonconductive and the transistor Q4 is controlled to be conductive. Accordingly, the level-shift amplified modulation signal AMs2 equivalent to the amplified modulation signal AMs1 output to the midpoint CP1 of the digital amplification circuit 550 is supplied to the midpoint CP2 of the level shift circuit 560.

Thereafter, the demodulation circuit 580 smooths and demodulates the level-shift amplified modulation signal AMs2 output from the midpoint CP2 of the level shift circuit 560 so that the driving signal COM constantly having the voltage Vc is output from the driving signal output circuit 50. Here, the period of time from the time point t0 to the time point t10 in which the potential of the driving signal COM is fixed to the voltage Vc is an example of a second period.

In a period from the time point t10 to a time point t20, the driving signal output circuit 50 outputs the driving signal COM having a voltage value changed from the voltage Vc to the voltage Vb. Specifically, in the period from the time point t10 to the time point t20, the base driving data dA for generating the driving signal COM having a voltage value changed from the voltage Vc to the voltage Vb is supplied to the base driving signal output circuit 510. The base driving signal output circuit 510 generates a base driving signal aA having a voltage value changed from the voltage aVc to the voltage aVb based on the supplied base driving data dA. The base driving signal aA generated by the base driving signal output circuit 510 is supplied to the pulse modulation circuit 530 through the adder 511, and in addition, supplied to the switching circuit 521 and the fixed pulse output circuit 522 included in the fixed output switching circuit 520.

Furthermore, since the voltage value of the supplied base driving signal aA is changed in the period from the time point t10 to the time point t20, the switching circuit 521 outputs a switch signal Sel to be used by the switch 531 to select the modulation signal Ms as the base gate signal Gd.

Consequently, the modulation signal Ms output from the pulse modulation circuit 530 is supplied as the base gate signal Gd to the digital amplification circuit 550. Then the gate driver 551 included in the digital amplification circuit 550 outputs the gate signal Hgs1 corresponding to a logical level of the supplied base gate signal Gd and the gate signal Lgs1 corresponding to a signal obtained by inverting the logical level of the base gate signal Gd, so as to output an amplified modulation signal AMs1 obtained by amplifying the base gate signal Gd based on the voltage VMV to the midpoint CP1 of the digital amplification circuit 550.

Furthermore, the base driving signal aA is also supplied to the reference level switching circuit 561 included in the level shift circuit 560. In the period from the time point t10 to the time point t20, since a potential of the base driving signal aA is lower than the threshold voltage Vth1, the reference level switching circuit 561 outputs the level switching signal Ls in a low level to the gate driver 562. Accordingly, the gate driver 562 outputs the gate signal Hgs2 in a low level to the transistor Q3 and the gate signal Lgs2 in a high level to the transistor Q4. As a result, the transistor Q3 is controlled to be nonconductive and the transistor Q4 is controlled to be conductive. Accordingly, the level-shift amplified modulation signal AMs2 equivalent to the amplified modulation signal AMs1 output to the midpoint CP1 of the digital amplification circuit 550 is supplied to the midpoint CP2 of the level shift circuit 560.

Thereafter, the demodulation circuit 580 smooths and demodulates the level-shift amplified modulation signal AMs2 output from the midpoint CP2 of the level shift circuit 560 so that a driving signal COM having a voltage value changed from the voltage Vc to the voltage Vb is output from the driving signal output circuit 50.

Furthermore, in the period from the time point t10 to the time point t20, since a voltage value of the base driving signal aA is changed from the voltage aVc to the voltage aVb, and therefore, becomes lower than the threshold voltage Vth2, the fixed pulse output circuit 522 changes a pulse width of the output pulse signal PDC to the first Duty.

In a period from the time point t20 to a time point t30, the driving signal output circuit 50 outputs a driving signal COM constantly having a voltage value of the voltage Vb. Specifically, in the period from the time point t20 to the time point t30, the base driving data dA for generating a driving signal COM constantly having a voltage value of the voltage Vb is supplied to the base driving signal output circuit 510. The base driving signal output circuit 510 generates a base driving signal aA constantly having the voltage aVb based on the supplied base driving data dA. The base driving signal aA generated by the base driving signal output circuit 510 is supplied to the pulse modulation circuit 530 through the adder 511, and in addition, supplied to the switching circuit 521 and the fixed pulse output circuit 522 included in the fixed output switching circuit 520.

Furthermore, since the voltage value of the supplied base driving signal aA is fixed to the voltage aVb in the period from the time point t20 to the time point t30, the switching circuit 521 outputs a switch signal Sel to be used by the switch 531 to select the pulse signal PDC as a base gate signal Gd. Consequently, the pulse signal PDC constantly having a pulse width of the first Duty output from the fixed pulse output circuit 522 is supplied to the digital amplification circuit 550 as the base gate signal Gd. Then the gate driver 551 included in the digital amplification circuit 550 outputs the gate signal Hgs1 corresponding to a logical level of the supplied base gate signal Gd and the gate signal Lgs1 corresponding to a signal obtained by inverting the logical level of the base gate signal Gd, so as to output an amplified modulation signal AMs1 obtained by amplifying the base gate signal Gd based on the voltage VMV to the midpoint CP1 of the digital amplification circuit 550.

Furthermore, the base driving signal aA is also supplied to the reference level switching circuit 561 included in the level shift circuit 560. In the period from the time point t20 to the time point t30, since a potential of the base driving signal aA is lower than the threshold voltage Vth1, the reference level switching circuit 561 outputs the level switching signal Ls in a low level to the gate driver 562. Accordingly, the gate driver 562 outputs the gate signal Hgs2 in a low level to the transistor Q3 and the gate signal Lgs2 in a high level to the transistor Q4. As a result, the transistor Q3 is controlled to be nonconductive and the transistor Q4 is controlled to be conductive. Accordingly, the level-shift amplified modulation signal AMs2 equivalent to the amplified modulation signal AMs1 output to the midpoint CP1 of the digital amplification circuit 550 is supplied to the midpoint CP2 of the level shift circuit 560.

Thereafter, the demodulation circuit 580 smooths and demodulates the level-shift amplified modulation signal AMs2 output from the midpoint CP2 of the level shift circuit 560 so that the driving signal COM constantly having the voltage Vb is output from the driving signal output circuit 50. Here, the period of time from the time point t20 to the time point t30 in which the potential of the driving signal COM is fixed to the voltage Vb is an example of a first period.

In a period from the time point t30 to a time point t40, the driving signal output circuit 50 outputs a driving signal COM having a voltage value changed from the voltage Vb to the voltage Vt. Specifically, in the period from the time point t30 to the time point t40, the base driving data dA for generating the driving signal COM having a voltage value changed from the voltage Vb to the voltage Vt is supplied to the base driving signal output circuit 510. The base driving signal output circuit 510 generates a base driving signal aA having a voltage value changed from a voltage aVb to a voltage aVt based on the supplied base driving data dA. The base driving signal aA generated by the base driving signal output circuit 510 is supplied to the pulse modulation circuit 530 through the adder 511, and in addition, supplied to the switching circuit 521 and the fixed pulse output circuit 522 included in the fixed output switching circuit 520.

Furthermore, since the voltage value of the supplied base driving signal aA is changed in the period from the time point t30 to the time point t40, the switching circuit 521 outputs the switch signal Sel to be used by the switch 531 to select the modulation signal Ms as the base gate signal Gd. Consequently, the modulation signal Ms output from the pulse modulation circuit 530 is supplied as the base gate signal Gd to the digital amplification circuit 550. Then the gate driver 551 included in the digital amplification circuit 550 outputs the gate signal Hgs1 corresponding to a logical level of the base gate signal Gd and the gate signal Lgs1 corresponding to a signal obtained by inverting the logical level of the base gate signal Gd, so as to output an amplified modulation signal AMs1 obtained by amplifying the base gate signal Gd based on the voltage VMV to the midpoint CP1 of the digital amplification circuit 550.

Furthermore, the base driving signal aA is also supplied to the reference level switching circuit 561 included in the level shift circuit 560. In a period from the time point t30 to a time point tc1 in which a voltage value of the base driving signal aA is smaller than the threshold voltage Vth1 in the period from the time point t30 to the time point t40, the reference level switching circuit 561 outputs the level switching signal Ls in a low level to the gate driver 562. Accordingly, the gate driver 562 outputs the gate signal Hgs2 in a low level to the transistor Q3 and the gate signal Lgs2 in a high level to the transistor Q4. As a result, the transistor Q3 is controlled to be nonconductive and the transistor Q4 is controlled to be conductive. Accordingly, the level-shift amplified modulation signal AMs2 equivalent to the amplified modulation signal AMs1 output to the midpoint CP1 of the digital amplification circuit 550 is supplied to the midpoint CP2 of the level shift circuit 560.

Furthermore, in a period from the time point tc1 to the time point t40 in which the voltage value of the base driving signal aA is larger than the threshold voltage Vth1 in the period from the time point t30 to the time point t40, the reference level switching circuit 561 outputs the level switching signal Ls in a high level to the gate driver 562. Accordingly, the gate driver 562 outputs the gate signal Hgs2 in a high level to the transistor Q3 and the gate signal Lgs2 in a low level to the transistor Q4. As a result, the transistor Q3 is controlled to be conductive and the transistor Q4 is controlled to be nonconductive. Accordingly, the level-shift amplified modulation signal AMs2 obtained when a bootstrap circuit including the capacitor C3 performs level shift, to the voltage VMV, on the reference potential of the amplified modulation signal AMs1 output to the midpoint CP1 of the digital amplification circuit 550 is output to the midpoint CP2 the level shift circuit 560. Specifically, the level shift circuit 560 switches the reference potential of the amplified modulation signal AMs1 between the ground potential GND and the potential of the voltage VMV. The ground potential GND is an example of a second potential, and the potential of the voltage VMV is an example of an eighth potential.

Thereafter, the demodulation circuit 580 smooths and demodulates the level-shift amplified modulation signal AMs2 output from the midpoint CP2 of the level shift circuit 560 so that the driving signal COM having a voltage value changed from the voltage Vb to the voltage Vt is output from the driving signal output circuit 50.

Furthermore, in the period from the time point t30 to the time point t40, in the course of the change of the voltage value of the base driving signal aA from the voltage aVb to the voltage aVt, the voltage value of the base driving signal aA becomes larger than the threshold voltage Vth2. Accordingly, the fixed pulse output circuit 522 changes a pulse width of the pulse signal PDC to be output to the second Duty. Thereafter, the voltage value of the base driving signal aA exceeds the threshold voltage Vth3. Accordingly, the fixed pulse output circuit 522 changes a pulse width of the pulse signal PDC to be output to the third Duty. Specifically, in the period from the time point t30 to the time point t40, in course of a change of the voltage value of the base driving signal aA from the voltage aVb to the voltage aVt, the fixed pulse output circuit 522 changes a pulse width of the output pulse signal PDC to be output from the first Duty to the third Duty In a period from the time point t40 to a time point t50, the driving signal output circuit 50 outputs the driving signal COM constantly having a voltage value of the voltage Vt. Specifically, in the period from the time point t40 to the time point t50, the base driving data dA for generating the driving signal COM constantly having a voltage value of the voltage Vt is supplied to the base driving signal output circuit 510. The base driving signal output circuit 510 generates a base driving signal aA constantly having the voltage aVt based on the supplied base driving data dA. The base driving signal aA generated by the base driving signal output circuit 510 is supplied to the pulse modulation circuit 530 through the adder 511, and in addition, supplied to the switching circuit 521 and the fixed pulse output circuit 522 included in the fixed output switching circuit 520.

Furthermore, since the voltage value of the supplied base driving signal aA is constant in the period from the time point t40 to the time point t50, the switching circuit 521 outputs a switch signal Sel to be used by the switch 531 to select the pulse signal PDC as the base gate signal Gd. Consequently, the pulse signal PDC constantly having a pulse width of the third Duty output from the fixed pulse output circuit 522 is supplied to the digital amplification circuit 550 as the base gate signal Gd. Then the gate driver 551 included in the digital amplification circuit 550 outputs the gate signal Hgs1 corresponding to a logical level of the supplied base gate signal Gd and the gate signal Lgs1 corresponding to a signal obtained by inverting the logical level of the base gate signal Gd, so as to output an amplified modulation signal AMs1 obtained by amplifying the base gate signal Gd based on the voltage VMV to the midpoint CP1 of the digital amplification circuit 550.

Furthermore, the base driving signal aA is also supplied to the reference level switching circuit 561 included in the level shift circuit 560. In the period from the time point t40 to the time point t50, since a potential of the base driving signal aA is higher than the threshold voltage Vth1, the reference level switching circuit 561 outputs the level switching signal Ls in a high level to the gate driver 562. Accordingly, the gate driver 562 outputs the gate signal Hgs2 in a high level to the transistor Q3 and the gate signal Lgs2 in a low level to the transistor Q4. As a result, the transistor Q3 is controlled to be conductive and the transistor Q4 is controlled to be nonconductive. Accordingly, the level-shift amplified modulation signal AMs2 obtained when a bootstrap circuit including the capacitor C3 performs level shift, to the voltage VMV, on the reference potential of the amplified modulation signal AMs1 output to the midpoint CP1 of the digital amplification circuit 550 is output to the midpoint CP2 the level shift circuit 560. Specifically, the level shift circuit 560 switches the reference potential of the amplified modulation signal AMs1 between the ground potential GND and the potential of the voltage VMV.

Thereafter, the demodulation circuit 580 smooths and demodulates the level-shift amplified modulation signal AMs2 output from the midpoint CP2 of the level shift circuit 560 so that the driving signal COM constantly having the voltage Vt is output from the driving signal output circuit 50. Here, the period of time from the time point t40 to the time point t50 in which the potential of the driving signal COM is fixed to the voltage Vt is an example of a third period.

In a period from the time point t50 to a time point t60, the driving signal output circuit 50 outputs the driving signal COM having a voltage value changed from the voltage Vt to the voltage Vc. Specifically, in the period from the time point t50 to the time point t60, the base driving data dA for generating the driving signal COM having a voltage value changed from the voltage Vt to the voltage Vc is supplied to the base driving signal output circuit 510. The base driving signal output circuit 510 generates the base driving signal aA constantly having a voltage value changed from the voltage aVt to a voltage aVc based on the supplied base driving data dA. The base driving signal aA generated by the base driving signal output circuit 510 is supplied to the pulse modulation circuit 530 through the adder 511, and in addition, supplied to the switching circuit 521 and the fixed pulse output circuit 522 included in the fixed output switching circuit 520.

Furthermore, since the voltage value of the supplied base driving signal aA is changed in the period from the time point t50 to the time point t60, the switching circuit 521 outputs the switch signal Sel to be used by the switch 531 to select the modulation signal Ms as the base gate signal Gd. Consequently, the modulation signal Ms output from the pulse modulation circuit 530 is supplied as the base gate signal Gd to the digital amplification circuit 550. Then the gate driver 551 included in the digital amplification circuit 550 outputs the gate signal Hgs1 corresponding to a logical level of the base gate signal Gd and the gate signal Lgs1 corresponding to a signal obtained by inverting the logical level of the base gate signal Gd, so as to output an amplified modulation signal AMs1 obtained by amplifying the base gate signal Gd based on the voltage VMV to the midpoint CP1 of the digital amplification circuit 550.

Furthermore, the base driving signal aA is also supplied to the reference level switching circuit 561 included in the level shift circuit 560. In a period from the time point t50 to a time point tc2 in which the voltage value of the base driving signal aA is larger than the threshold voltage Vth1 in the period from the time point t50 to the time point t60, the reference level switching circuit 561 outputs the level switching signal Ls in a high level to the gate driver 562. Accordingly, the gate driver 562 outputs the gate signal Hgs2 in a high level to the transistor Q3 and the gate signal Lgs2 in a low level to the transistor Q4. As a result, the transistor Q3 is controlled to be conductive and the transistor Q4 is controlled to be nonconductive. Accordingly, the level-shift amplified modulation signal AMs2 obtained when a bootstrap circuit including the capacitor C3 performs level shift, to the voltage VMV, on the reference potential of the amplified modulation signal AMs1 output to the midpoint CP1 of the digital amplification circuit 550 is output to the midpoint CP2 the level shift circuit 560. Specifically, the level shift circuit 560 switches the reference potential of the amplified modulation signal AMs1 between the ground potential GND and the potential of the voltage VMV.

Furthermore, in a period from the time point tc2 to the time point t60 in which a voltage value of the base driving signal aA is smaller than the threshold voltage Vth1 in the period from the time point t50 to the time point t60, the reference level switching circuit 561 outputs the level switching signal Ls in a low level to the gate driver 562. Accordingly, the gate driver 562 outputs the gate signal Hgs2 in a low level to the transistor Q3 and the gate signal Lgs2 in a high level to the transistor Q4. As a result, the transistor Q3 is controlled to be nonconductive and the transistor Q4 is controlled to be conductive. Accordingly, the level-shift amplified modulation signal AMs2 equivalent to the amplified modulation signal AMs1 output to the midpoint CP1 of the digital amplification circuit 550 is supplied to the midpoint CP2 of the level shift circuit 560.

Thereafter, the demodulation circuit 580 smooths and demodulates the level-shift amplified modulation signal AMs2 output from the midpoint CP2 of the level shift circuit 560 so that the driving signal COM having a voltage value changed from the voltage Vt to the voltage Vc is output from the driving signal output circuit 50.

Furthermore, in the period from the time point t50 to the time point t60, since a voltage value of the base driving signal aA is changed from the voltage aVt to the voltage aVc and a voltage value of the base driving signal aA becomes lower than the threshold voltage Vth3, the fixed pulse output circuit 522 changes a pulse width of the output pulse signal PDC to the second Duty.

In a period from the time point t60 to a time point t70, the driving signal output circuit 50 outputs the driving signal COM constantly having a voltage value of the voltage Vc. Specifically, in the period from the time point t60 to the time point t70, the base driving data dA for generating the driving signal COM constantly having a voltage value of the voltage Vc is supplied to the base driving signal output circuit 510. The base driving signal output circuit 510 generates a base driving signal aA constantly having a voltage aVc based on the supplied base driving data dA. The base driving signal aA generated by the base driving signal output circuit 510 is supplied to the pulse modulation circuit 530 through the adder 511, and in addition, supplied to the switching circuit 521 and the fixed pulse output circuit 522 included in the fixed output switching circuit 520.

Furthermore, since the voltage value of the supplied base driving signal aA is constant in the period from the time point t60 to the time point t70, the switching circuit 521 outputs the switch signal Sel to be used by the switch 531 to select the pulse signal PDC as the base gate signal Gd. Consequently, the pulse signal PDC constantly having a pulse width of the second Duty output from the fixed pulse output circuit 522 is supplied as the base gate signal Gd to the digital amplification circuit 550. Then the gate driver 551 included in the digital amplification circuit 550 outputs the gate signal Hgs1 corresponding to a logical level of the supplied base gate signal Gd and the gate signal Lgs1 corresponding to a signal obtained by inverting the logical level of the base gate signal Gd, so as to output an amplified modulation signal AMs1 obtained by amplifying the base gate signal Gd based on the voltage VMV to the midpoint CP1 of the digital amplification circuit 550.

Furthermore, the base driving signal aA is also supplied to the reference level switching circuit 561 included in the level shift circuit 560. In the period from the time point t60 to the time point t70, since a potential of the base driving signal aA is lower than the threshold voltage Vth1, the reference level switching circuit 561 outputs the level switching signal Ls in a low level to the gate driver 562. Accordingly, the gate driver 562 outputs the gate signal Hgs2 in a low level to the transistor Q3 and the gate signal Lgs2 in a high level to the transistor Q4. As a result, the transistor Q3 is controlled to be nonconductive and the transistor Q4 is controlled to be conductive. Accordingly, the level-shift amplified modulation signal AMs2 equivalent to the amplified modulation signal AMs1 output to the midpoint CP1 of the digital amplification circuit 550 is supplied to the midpoint CP2 of the level shift circuit 560.

Thereafter, the demodulation circuit 580 smooths and demodulates the level-shift amplified modulation signal AMs2 output from the midpoint CP2 of the level shift circuit 560 so that the driving signal COM constantly having the voltage Vc is output from the driving signal output circuit 50. The time point t70 corresponds to the time point t0 in FIG. 7. Accordingly, the driving signal output circuit 50 generates and outputs the driving signal COM repeatedly including the trapezoidal waveform Adp in every cycle T.

Here, the period of time from the time point t60 to the time point t70 in which the potential of the driving signal COM is fixed in the voltage Vc is another example of the second period. When the time point t70 corresponds to the time point to, a period of time from the time point t60 to the time point t10 is also an example of the second period.

As described above, the gate driver 562 of the driving signal output circuit 50 included in the liquid ejecting apparatus 1 according to this embodiment outputs, in a period of time from the time point t0 to the time point t10 and a period of time from the time point t60 to the time point t70 in which the potential of the driving signal COM is fixed in the voltage Vc, the gate signal Lgs2 for controlling the transistor Q4 to be conductive and the gate signal Hgs2 for controlling the transistor Q3 to be nonconductive. Specifically, in the period of time from the time point t0 to the time point t10 and the period of time from the time point t60 to the time point t70 in which the potential of the driving signal COM is fixed in the voltage Vc, the transistor Q4 is controlled to be conductive and the transistor Q3 is controlled to be nonconductive.

The transistor Q4 is driven by a voltage HVdd2 that has a potential larger by the voltage Vg than the voltage HVss2 input to the low-potential-side input terminal and that is generated by the bootstrap circuit including the capacitor C2 and the diode D2. However, a potential of the voltage HVdd2 is gradually lowered due to leakage current or the like that occurs through the capacitor C2, the gate drive circuit 563, and other circuit elements, and consequently, driving stability of the transistor Q4 may be degraded. In particular, the period of time in which the voltage Vc included in the driving signal COM is fixed functions as the period of time in which vibration that does not contribute to ejection of ink and ink generated in the vibration plate 621 is stopped as described above, and therefore, is set to be longer than the period of time in which the voltage Vb is fixed and the period of time in which the voltage Vt is fixed. Therefore, in the period of time in which the voltage Vc included in the driving signal COM is fixed, reduction of the possibility that a potential of the voltage HVdd2 is lowered is required.

To address this problem, in the driving signal output circuit 50 according to this embodiment, in the period of time from the time point t0 to the time point t10 and the period of time from the time point t60 to the time point t70 in which the potential of the driving signal COM is fixed in the voltage Vc, the transistor Q4 is controlled to be conductive and the transistor Q3 is controlled to be nonconductive. Consequently, a potential of the midpoint CP2 coupled to the capacitor C2 corresponds to a potential of the midpoint CP1 to which the amplified modulation signal AMs1 generated when the transistors Q1 and Q2 of the digital amplification circuit 550 performs a switching operation is supplied. Accordingly, a potential of the voltage HVdd2 generated by the bootstrap circuit including the capacitor C2 and the diode D2 is larger by the voltage Vg than the voltage HVss2. Consequently, driving stability of the transistor Q3 is improved, and driving stability of the driving signal output circuit 50 is improved.

Furthermore, the gate driver 562 determines, based on a potential of the base driving signal aA, whether the gate signal Lgs2 for controlling the transistor Q4 to be conductive and the gate signal Hgs2 for controlling the transistor Q3 to be nonconductive are to be output or the gate signal Lgs2 for controlling the transistor Q4 to be nonconductive and the gate signal Hgs2 for controlling the transistor Q3 to be conductive are to be output. Specifically, as illustrated in FIG. 7, when the potential of the base driving signal aA is lower than the threshold voltage Vth1 that is a predetermined potential, the gate driver 562 outputs the gate signal Lgs2 for controlling the transistor Q4 to be conductive and the gate signal Hgs2 for controlling the transistor Q3 to be nonconductive, whereas when the potential of the base driving signal aA is higher than the threshold voltage Vth1, the gate driver 562 outputs the gate signal Lgs2 for controlling the transistor Q4 to be nonconductive and the gate signal Hgs2 for controlling the transistor Q3 to be conductive.

As described above, since the gate driver 562 determines, based on a potential of the base driving signal aA, whether the gate signal Lgs2 for controlling the transistor Q4 to be conductive and the gate signal Hgs2 for controlling the transistor Q3 to be nonconductive are to be output or the gate signal Lgs2 for controlling the transistor Q4 to be nonconductive and the gate signal Hgs2 for controlling the transistor Q3 to be conductive are to be output, the gate driver 562 may control the transistors Q3 and Q4 at a timing in accordance with the voltage value of the driving signal COM output from the driving signal output circuit 50. Specifically, when the potential of the voltage HVdd2 may be lowered since the potential of the driving signal COM is fixed, the transistors Q3 and Q4 may be controlled, driving stability of the transistor Q4 is further improved, and driving stability of the driving signal output circuit 50 is further improved.

Furthermore, as illustrated in FIG. 7, the voltage Vc is preferably lower than the voltage VMV supplied to the transistor Q1 included in the digital amplification circuit 550. Accordingly, the period of time in which the driving signal output circuit 50 outputs the voltage Vc as the driving signal COM corresponds to a period of time in which the level shift circuit 560 outputs the level-shift amplified modulation signal AMs2 using the ground potential GND as a reference potential of the amplified modulation signal AMs1. Accordingly, potential vibration in the midpoint CP2 is increased, and a potential of the voltage HVdd2 generated by the bootstrap circuit including the capacitor C2 and the diode D2 becomes stable. Consequently, driving stability of the transistor Q4 is further improved, and driving stability of the driving signal output circuit 50 is further improved.

Here, in the base driving signal aA that is a base of the driving signal COM, the voltage aVb of a fixed potential is an example of a fourth potential, the voltage aVc of a fixed potential is an example of a fifth potential, and the voltage aVt of a fixed potential is an example of a sixth potential. The period of time from the time point t20 to t30 in which the potential of the base driving signal aA is fixed in the voltage aVb is an example of a fourth period, at least one of a period of time from the time point t0 to the time point t10 and a period of time from the time point t60 to the time point t70 in which the potential of the base driving signal aA is fixed in the voltage aVc is an example of a fifth period, and the period of time from the time point t40 to the time point t50 in which the potential of the base driving signal aA is fixed in the voltage aVt is an example of a sixth period. Specifically, the base driving signal aA includes the period of time from the time point t20 to the time point t30 in which the voltage aVb is fixed, the period of time from the time point t0 to the time point t10 and the period of time from the time point t60 to the time point t70 in which the voltage aVc is fixed, and the period of time from the time point t20 to the time point t30 in which the voltage aVt is fixed.

4. Correction for Change in Features of Driving Section

Here, features of the ejection portions 600 included in the liquid ejecting apparatus 1 are changed in accordance with ambient environment including temperature and humidity and a period of use. The change in the features of the ejection portions 600 affects an ejection feature. Therefore, in the liquid ejecting apparatus 1, the signal waveform of the driving signal COM is corrected in accordance with the feature change of the ejection portions 600 so that the possibility that the ejection feature of the ink is degraded due to the feature change of the ejection portions 600 is reduced. However, when the waveform of the driving signal COM is corrected, the correlation between the signal waveform of the driving signal COM and the voltage VMV is changed, and as a result, the capacitor C2 may not be sufficiently charged. Consequently, the potential of the voltage HVdd1 is lowered, and therefore, driving stability of the transistor Q4 may be degraded. To address this problem, a plurality of corrections for reducing the possibility that the potential of the voltage HVdd1 is lowered will be illustrated hereinafter.

4.1 Correction of Potential of Voltage VMV for Waveform Correction of Driving Signal COM As a first correction, when the waveform of the driving signal COM is corrected in accordance with the feature change of the ejection portions 600, the potential of the voltage VMV is corrected in accordance with the potential of the voltage Vc included in the driving signal COM obtained after the correction. FIGS. 8A to 8C are diagrams illustrating the correction of the potential of the voltage VMV performed in accordance with the waveform correction of the driving signal COM. Note that, in FIGS. 8A to 8C, the followings are illustrated: (8A) waveforms of the driving signal COM and the voltage VMV before correction, (8B) correction of the driving signal COM when the feature change occurs in the ejection portions 600, and (8C) correction of the voltage VMV in accordance with the correction of the driving signal COM.

As illustrated in FIG. 8A, before the feature change of the ejection portions 600 occurs, the voltage VMV is positioned in a higher potential than the potential of the voltage Vc of the driving signal COM.

In accordance with the feature change in the ejection portions 600, when viscosity of the stored ink is increased, the driving signal output circuit 50 generates and outputs a driving signal COM including a trapezoidal waveform Adp' obtained by correcting the potential of the voltage Vt to obtain a voltage Vt' of a higher potential than the voltage Vt so that a potential difference between the voltage Vt and the voltage Vb included in the trapezoidal waveform Adp of the driving signal COM is increased as illustrated in FIG. 8B.

Specifically, the controller 100 detects increase in viscosity in the ejection portions 600 using a sensor or the like, not illustrated. When detecting the increase in viscosity in the ejection portions 600, the controller 100 generates base driving data dA for increasing the potential of the voltage Vt included in the driving signal COM to the voltage Vt' that is higher than the voltage Vt so that stable ejection of the ink having the increased viscosity is enabled, and outputs the base driving data dA to the driving signal output circuit 50. Furthermore, in this case, to balance the relationship between supply of the ink to the ejection portions 600 and ejection of the ink from the ejection portions 600, the controller 100 generates base driving data dA for increasing the potential of the voltage Vc to a voltage Vc' that is higher than the voltage Vc in accordance with an amount of increase in the potential obtained when the voltage Vt is increased to the voltage Vt', and outputs the base driving data dA to the driving signal output circuit 50.

The driving signal output circuit 50 generates, based on the base driving data dA, a base driving signal aA' including a voltage aVt' that has a higher potential than the voltage aVt and a voltage aVc' that has a higher potential than the voltage aVc, and in addition, generates a driving signal COM including the trapezoidal waveform Adp' based on the generated base driving signal aA'. The generated driving signal COM is output to the ejection portions 600. Accordingly, even when the viscosity of the ink is increased, the ink may be stably ejected from the ejection portions 600.

However, as illustrated in FIG. 8B, before correction of the driving signal COM, the capacitor C2 may not be sufficiently charged when the potential of the Vc' is higher than the voltage VMV. Consequently, the potential of the voltage HVdd1 is lowered, and therefore, driving stability of the transistor Q4 may be degraded. To address this problem, as illustrated in FIG. 8C, the power source circuit 70 executes correction such that the potential of the voltage VMV is increased to a voltage VMV' that is higher than the voltage VMV and the voltage Vc so that the potential of the voltage VMV becomes larger than the voltage Vc'. Specifically, the power source circuit 70 changes the potential of the voltage VMV based on the feature change in the ejection portions 600 and the potential of the voltage aVc with respect to the voltage Vc of the driving signal COM. Accordingly, a potential of the voltage Vc' may become lower than the voltage VMV supplied to the transistor Q1 included in the digital amplification circuit 550 preferably lower than the voltage VMV supplied to the transistor included in the digital amplification circuit 550. Accordingly, the period of time in which the driving signal output circuit 50 outputs the voltage Vc as the driving signal COM corresponds to a period of time in which the level shift circuit 560 outputs the level-shift amplified modulation signal AMs2 using the ground potential GND as a reference potential of the amplified modulation signal AMs1. Accordingly, potential vibration in the midpoint CP2 is increased, and a potential of the voltage HVdd2 generated by the bootstrap circuit including the capacitor C2 and the diode D2 becomes stable. Specifically, even when the waveform of the driving signal COM is corrected in accordance with the feature change in the ejection portions 600, driving stability of the transistor Q4 and driving stability of the driving signal output circuit 50 are improved.

4.2 Waveform Correction of Driving Signal COM for Potential of Voltage VMV

As a second correction, when the waveform of the driving signal COM is corrected in accordance with the feature change in the ejection portions 600, the potential of the voltage Vc included in the driving signal COM after the correction is corrected in accordance with the potential of the voltage VMV. FIGS. 9A to 9C are diagrams illustrating correction of a voltage Vc performed in accordance with a potential of the voltage VMV. Note that, in FIGS. 9A to 9C, the followings are illustrated: (9A) waveforms of the driving signal COM and the voltage VMV before correction, (9B) correction of the driving signal COM when the feature change occurs in the ejection portions 600, and (9C) correction of the voltage Vc in accordance with the potential of the voltage VMV.

As illustrated in FIG. 9A, before the feature change in the ejection portions 600 occurs, the voltage VMV is positioned in a higher potential than the potential of the voltage Vc of the driving signal COM.

As with the case of FIGS. 8A to 8C, in accordance with the feature change in the ejection portions 600, when viscosity of the stored ink is increased, the driving signal output circuit 50 generates and outputs a driving signal COM including a trapezoidal waveform Adp' obtained by correcting the potential of the voltage Vt to obtain a voltage Vt' of a higher potential than the voltage Vt so that a potential difference between the voltage Vt and the voltage Vb included in the trapezoidal waveform Adp of the driving signal COM is increased as illustrated in FIG. 8B. Consequently, as illustrated in FIG. 9B, before correction of the driving signal COM, the capacitor C2 may not be sufficiently charged when the potential of the Vc' is higher than the voltage VMV. Consequently, the potential of the voltage HVdd1 is lowered, and therefore, driving stability of the transistor Q4 may be degraded.

In the second correction illustrated in FIGS. 9A to 9C, as illustrated in FIG. 9C, the controller 100 generates base driving data dA such that a potential of the voltage Vc' included in the driving signal COM becomes smaller than the potential of the voltage VMV and outputs the base driving data dA to the driving signal output circuit 50 so as to correct the potential of the voltage Vc' to a voltage Vc" of a potential lower than the potential of the voltage VMV. Specifically, the controller 100 outputs a base driving signal aA" including a voltage aVc" used to obtain the voltage Vc" from the voltage Vc' of the trapezoidal waveform Adp' based on the potential of the voltage VMV. In other words, the controller 100 changes the potential of the voltage aVc of the base driving signal aA based on the potential of the voltage VMV. Accordingly, a potential of the voltage Vc" may become lower than the voltage VMV supplied to the transistor Q1 included in the digital amplification circuit 550 preferably lower than the voltage VMV supplied to the transistor included in the digital amplification circuit 550. Accordingly, the period of time in which the driving signal output circuit 50 outputs the voltage Vc" as the driving signal COM corresponds to a period of time in which the level shift circuit 560 outputs the level-shift amplified modulation signal AMs2 using the ground potential GND as a reference potential of the amplified modulation signal AMs1. Accordingly, potential vibration in the midpoint CP2 is increased, and a potential of the voltage HVdd2 generated by the bootstrap circuit including the capacitor C2 and the diode D2 becomes stable. Specifically, even when the waveform of the driving signal COM is corrected in accordance with the feature change in the ejection portions 600, driving stability of the transistor Q4 and driving stability of the driving signal output circuit 50 are improved.

4.3 Waveform Correction of Driving Signal COM Independent from Potential of Voltage VMV As a third correction, when the waveform of the driving signal COM is corrected in accordance with a feature change in the ejection portions 600, the potential of the voltage Vb and the potential of the voltage Vt included in the driving signal COM are changed so that a potential difference between the voltage Vt and the voltage Vb included in the driving signal COM is increased. FIGS. 10A and 10B are diagrams illustrating waveform correction of the driving signal based on potentials of voltages Vb and Vt. Note that the followings are illustrated in FIGS. 10A and 10B: (10A) waveforms of the driving signal COM and the voltage VMV before correction, and (10) waveforms of the driving signal COM and the voltage VMV after the correction.

As illustrated in FIG. 10A, before the feature change in the ejection portions 600 occurs, the voltage VMV is positioned in a higher potential than the potential of the voltage Vc of the driving signal COM.

In accordance with the feature change in the ejection portions 600, when viscosity of the stored ink is increased, the driving signal output circuit 50 generates and outputs a driving signal COM including a trapezoidal waveform Adp' obtained by correcting the potential of the voltage Vt to obtain a voltage Vt' of a higher potential than the voltage Vt and correcting the potential of the voltage Vb to obtain a potential Vb' of a lower potential than the voltage Vb so that a potential difference between the voltage Vt and the voltage Vb included in the trapezoidal waveform Adp of the driving signal COM is increased as illustrated in FIG. 10B.

Specifically, the controller 100 detects increase in viscosity in the ejection portions 600 using a sensor or the like, not illustrated. When detecting the increase in viscosity in the ejection portions 600, the controller 100 generates base driving data dA for increasing the potential of the voltage Vt included in the driving signal COM to the voltage Vt' that is higher than the voltage Vt so that stability of ejection of the ink having the increased viscosity is enabled, and outputs the base driving data dA to the driving signal output circuit 50. In addition, the controller 100 generates base driving data dA for reducing the potential of the voltage Vb included in the driving signal COM to the voltage Vb' having a lower potential than the voltage Vb, and outputs the base driving data dA to the driving signal output circuit 50 In this case, the base driving data dA output from the controller 100 includes information for generating the voltage Vc' having a potential equivalent to the voltage Vc.

The driving signal output circuit 50 generates, based on the base driving data dA, a base driving signal aA' including a voltage aVt' that has a higher potential than the voltage aVt, the voltage aVb' that has a lower potential than the voltage aVb, and a voltage aVc' that has a potential equivalent to the voltage aVc, and in addition, generates a driving signal COM including the trapezoidal waveform Adp' based on the generated base driving signal aA'. The generated driving signal COM is output to the ejection portions 600. Accordingly, even when the viscosity of the ink is increased, the ink may be stably ejected from the ejection portions 600.

In the driving signal COM including the trapezoidal waveform Adp' corrected as described above, the potential of the voltage Vc' is lower than the potential of the voltage VMV. Accordingly, the period of time in which the driving signal output circuit 50 outputs the voltage Vc as the driving signal COM corresponds to a period of time in which the level shift circuit 560 outputs the level-shift amplified modulation signal AMs2 using the ground potential GND as a reference potential of the amplified modulation signal AMs1. Accordingly, potential vibration in the midpoint CP2 is increased, and a potential of the voltage HVdd2 generated by the bootstrap circuit including the capacitor C2 and the diode D2 becomes stable. Specifically, even when the waveform of the driving signal COM is corrected in accordance with the feature change in the ejection portions 600, driving stability of the transistor Q4 and driving stability of the driving signal output circuit 50 are improved. Specifically, in the third correction, since the controller 100 changes the potential of the voltage aVt included in the base driving signal aA to the voltage aVt' and the potential of the voltage aVb included in the base driving signal aA to the voltage aVb', even when the waveform of the driving signal COM is corrected in accordance with the feature change in the ejection portions 600, driving stability of the transistor Q4 and driving stability of the driving signal output circuit 50 are improved.

Here, taking the fact that the base driving signal aA is based on the base driving data dA into consideration, the base driving data dA is also an example of a base driving signal, and the controller 100 that outputs the base driving data dA is an example of a base driving signal circuit. Then the control unit 10 including the controller 100, the power source circuit 70, and the driving signal output circuit 50 corresponds to a driving circuit.

5. Effects

In the liquid ejecting apparatus 1 according to this embodiment, in the period of time from the time point t0 to the time point t10 and the period of time from the time point t60 to the time point t70 in which the potential of the driving signal COM is fixed in the voltage Vc that is lower than the voltage Vt and higher than the voltage Vb, the gate driver 562 included in the driving signal output circuit 50 outputs the gate signal Lgs2 for controlling the transistor Q4 to be conductive and the gate signal Hgs2 for controlling the transistor Q3 to be nonconductive so that the transistor Q4 is controlled to be conductive and the transistor Q3 is controlled to be nonconductive in a period of time in which potential of the driving signal COM is fixed in the voltage Vc. Consequently, a potential of the midpoint CP2 coupled to the capacitor C2 corresponds to a potential of the midpoint CP1 to which the amplified modulation signal AMs1 generated when the transistors Q1 and Q2 of the digital amplification circuit 550 performs a switching operation is supplied. Accordingly, a potential of the voltage HVdd2 generated by the bootstrap circuit including the capacitor C2 and the diode D2 is larger by the voltage Vg than the voltage HVss2. Consequently, driving stability of the transistor Q3 is improved, and driving stability of the driving signal output circuit 50 is improved.

Although the embodiments have been described hereinabove, the present disclosure is not limited to these embodiments and various modifications may be made without departing from the scope of the disclosure. For example, the foregoing embodiments may be appropriately combined with each other.

The present disclosure includes configurations substantially the same as the configurations described in the foregoing embodiments (for example, configurations having the same functions, methods, and results, or configurations having the same purposes and effects). Furthermore, the present disclosure includes configurations obtained by replacing a portion that is not essential to the configurations of the foregoing embodiments. Moreover, the present disclosure includes configurations that may attain the same effects or the same purposes as the configurations described in the foregoing embodiments. Furthermore, the present disclosure includes configurations obtained by adding the general techniques to the configurations of the foregoing embodiments.

The following is lead from the embodiments described above.

According to an aspect of a driving circuit, the driving circuit that outputs a driving signal for driving a driving section includes a modulation circuit configured to modulate a base driving signal that is a base of the driving signal and output a modulation signal, an amplification circuit configured to output, from a first output point, an amplified modulation signal obtained by amplifying the modulation signal, a level shift circuit configured to output, from a second output point, a level-shift amplified modulation signal obtained by shifting a potential of the amplified modulation signal, and a demodulation circuit configured to demodulate the level-shift amplified modulation signal and output the driving signal. The amplification circuit includes a first gate driver that outputs, based on the modulation signal, a first gate signal and a second gate signal, a first transistor that has one end electrically coupled to the first output point and that operates based on the first gate signal, and a second transistor that has one end electrically coupled to the first output point and the other end to which a first power source voltage is supplied and that operates based on the second gate signal. The level shift circuit includes a second gate driver that outputs, based on the base driving signal, a third gate signal and a fourth gate signal, a third transistor that has one end electrically coupled to the second output point and the other end electrically coupled to the first output point and that operates based on the third gate signal, a fourth transistor that has one end electrically coupled to the second output point and that operates based on the fourth gate signal, a first capacitance element that has one end electrically coupled to the first output point and the other end electrically coupled to the other end of the fourth transistor, and a second capacitance element that has one end electrically coupled to the one end of the fourth transistor and the other end which is electrically coupled to the second gate driver and to which a second power source voltage is supplied. The driving signal includes a first period in which a first potential is fixed, a second period in which a second potential higher than the first potential is fixed, and a third period in which a third potential higher than the second potential is fixed. The second gate driver outputs, in the second period, the third gate signal for controlling the third transistor to be conductive and the fourth gate signal for controlling the fourth transistor to be nonconductive.

According to this driving circuit, in a period of time in which a potential of the driving signal is fixed in the second potential that is higher than the first potential and lower than the third potential, the second gate driver outputs the third gate signal for controlling the third transistor to be conductive and the fourth gate signal for controlling the fourth transistor to be nonconductive so that the third transistor is controlled to be conductive and the fourth transistor is controlled to be nonconductive in a period of time in which the second potential is fixed. Accordingly, a potential of the second output point coupled to the second capacitance element corresponds to a potential of the first output point that outputs an amplified modulation signal generated by a switching operation of the first transistor and the second transistor included in the amplification circuit. Accordingly, the second capacitance element stores electric charge in accordance with an operation of the amplification circuit. Then the second gate driver generates the fourth gate signal for driving the fourth transistor based on the electric charge stored in the second capacitance element, so that driving stability of the fourth transistor is improved, and as a result, driving stability of the driving circuit is improved.

In the aspect of the driving circuit, the second gate driver may determine, based on a potential of the base driving signal, whether the third gate signal for controlling the third transistor to be conductive and the fourth gate signal for controlling the fourth transistor to be nonconductive are to be output or the third gate signal for controlling the third transistor to be nonconductive and the fourth gate signal for controlling the fourth transistor to be conductive are to be output.

According to this driving circuit, the number of times the third transistor and the fourth transistor are switched may be reduced when compared with that of the first transistor and the second transistor. Consequently, switching losses generated in the level shift circuit may be reduced and power consumption of the driving circuit may be reduced.

In the aspect of the driving circuit, the second gate driver may output, when a potential of the base driving signal is lower than a predetermined potential, the third gate signal for controlling the third transistor to be conductive and the fourth gate signal for controlling the fourth transistor to be nonconductive, and when a potential of the base driving signal is higher than the predetermined potential, the third gate signal for controlling the third transistor to be nonconductive and the fourth gate signal for controlling the fourth transistor to be conductive.

According to this driving circuit, the number of times the third transistor and the fourth transistor are switched may be reduced when compared with that of the first transistor and the second transistor. Consequently, switching losses generated in the level shift circuit may be reduced and power consumption of the driving circuit may be reduced.

In the driving circuit, the second potential may be smaller than a potential of the first power source voltage.

According to this driving circuit, electric charge may be reliably stored in the second capacitance element, and reliable output of the fourth gate signal that is generated by the second gate driver based on the electric charge stored in the second capacitance element and that is used to drive the fourth transistor is attained. Accordingly, driving stability of the fourth transistor is further improved, and consequently, driving stability of the driving circuit is further improved.

In the aspect of the driving circuit, the driving circuit may further include a base driving signal circuit configured to output the base driving signal. The base driving signal may include a fourth period in which a fourth potential is fixed, a fifth period in which a fifth potential higher than the fourth potential is fixed, and a sixth period in which a sixth potential higher than the fifth potential is fixed. The base driving signal circuit may change, based on a potential of the first power source voltage, the fifth potential.

According to this driving circuit, even when the potential of the first power source voltage is changed, the fifth potential of the base driving signal is changed based on the change of the first power source voltage so that the second potential of the driving signal may be changed. Consequently, electric charge may be reliably stored in the second capacitance element. Accordingly, stable output of the fourth gate signal that is generated by the second gate driver based on the electric charge stored in the second capacitance element and that drives the fourth transistor is attained and driving stability of the fourth transistor is further improved. As a result, driving stability of the driving circuit is improved.

In the aspect of the driving circuit, the driving circuit may further include a base driving signal circuit configured to output the base driving signal. The base driving signal includes a fourth period in which a fourth potential is fixed, a fifth period in which a fifth potential higher than the fourth potential is fixed, and a sixth period in which a sixth potential higher than the fifth potential is fixed. The base driving signal circuit may change, based on a feature change of the driving section, at least one of the fourth potential and the sixth potential.

According to this driving circuit, even when a feature of the driving section is changed, a sufficient potential difference is generated in the driving signal by changing the fourth potential and the sixth potential of the base driving signal, and accordingly, sufficient power may be supplied to the driving section. Furthermore, when the fifth potential is fixed, the relationship between the second potential of the driving signal generated based on the base driving signal and the potential of the first power source voltage may be maintained, and consequently, electric charge may be reliably stored in the second capacitance element. Accordingly, stable output of the fourth gate signal that is generated by the second gate driver based on the electric charge stored in the second capacitance element and that drives the fourth transistor is attained and driving stability of the fourth transistor is further improved. As a result, driving stability of the driving circuit is improved.

In the aspect of the driving circuit, the driving circuit may further include a power source circuit configured to output the first power source voltage. The power source circuit may change, based on a feature change of the driving section, a potential of the first power source voltage.

According to this driving circuit, even when the waveform of the driving signal is corrected due to a change in a feature of the driving section, the relationship between the second potential of the driving signal generated based on the base driving signal and the potential of the first power source voltage may be maintained by changing the potential of the first power source voltage. Consequently, electric charge may be reliably stored in the second capacitance element. Accordingly, stable output of the fourth gate signal that is generated by the second gate driver based on the electric charge stored in the second capacitance element and that drives the fourth transistor is attained and driving stability of the fourth transistor is further improved. As a result, driving stability of the driving circuit is improved.

In the aspect of the driving circuit, the driving circuit may further include a power source circuit configured to output the first power source voltage. The base driving signal includes a fourth period in which a fourth potential is fixed, a fifth period in which a fifth potential higher than the fourth potential is fixed, and a sixth period in which a sixth potential higher than the fifth potential is fixed. The power source circuit may change, based on the fifth potential, the potential of the first power source voltage.

According to this driving circuit, even when the waveform of the driving signal is changed, the relationship between the second potential of the driving signal generated based on the base driving signal and the potential of the first power source voltage may be maintained by changing the potential of the first power source voltage based on the fifth potential of the base driving signal. Consequently, electric charge may be reliably stored in the second capacitance element. Accordingly, stable output of the fourth gate signal that is generated by the second gate driver based on the electric charge stored in the second capacitance element and that drives the fourth transistor is attained and driving stability of the fourth transistor is further improved. As a result, driving stability of the driving circuit is improved.

In the aspect of the driving circuit, the level shift circuit may switch a reference potential of the amplified modulation signal between a seventh potential and an eighth potential higher than the seventh potential.

In the aspect of the driving circuit, the seventh potential may be a ground potential, and the eighth potential may be a potential of the first power source voltage.

According to an aspect of a liquid ejecting apparatus, the liquid ejecting apparatus includes an ejection portion configured to eject liquid, and a driving circuit configured to output a driving signal for driving the ejection portion. The driving circuit includes a modulation circuit configured to modulate a base driving signal that is a base of the driving signal and output a modulation signal, an amplification circuit configured to output, from a first output point, an amplified modulation signal obtained by amplifying the modulation signal, a level shift circuit configured to output, from a second output point, a level-shift amplified modulation signal obtained by shifting a potential of the amplified modulation signal, and a demodulation circuit configured to demodulate the level-shift amplified modulation signal and output the driving signal. The amplification circuit includes a first gate driver that outputs, based on the modulation signal, a first gate signal and a second gate signal, a first transistor that has one end electrically coupled to the first output point and that operates based on the first gate signal, and a second transistor that has one end electrically coupled to the first output point and the other end to which a first power source voltage is supplied and that operates based on the second gate signal. The level shift circuit includes a second gate driver that outputs, based on the base driving signal, a third gate signal and a fourth gate signal, a third transistor that has one end electrically coupled to the second output point and the other end electrically coupled to the first output point and that operates based on the third gate signal, a fourth transistor that has one end electrically coupled to the second output point and that operates based on the fourth gate signal, a first capacitance element that has one end electrically coupled to the first output point and the other end electrically coupled to the other end of the fourth transistor, and a second capacitance element that has one end electrically coupled to the one end of the fourth transistor and the other end which is electrically coupled to the second gate driver and to which a second power source voltage is supplied. The driving signal includes a first period in which a first potential is fixed, a second period in which a second potential higher than the first potential is fixed, and a third period in which a third potential higher than the second potential is fixed. The second gate driver outputs, in the second period, the third gate signal for controlling the third transistor to be conductive and the fourth gate signal for controlling the fourth transistor to be nonconductive.

According to this liquid ejecting apparatus, in the driving circuit, in a period of time in which a potential of the driving signal is fixed in the second potential that is higher than the first potential and lower than the third potential, the second gate driver outputs the third gate signal for controlling the third transistor to be conductive and the fourth gate signal for controlling the fourth transistor to be nonconductive so that the third transistor is controlled to be conductive and the fourth transistor is controlled to be nonconductive in a period of time in which the second potential is fixed. Accordingly, a potential of the second output point coupled to the second capacitance element corresponds to a potential of the first output point that outputs an amplified modulation signal generated by a switching operation of the first transistor and the second transistor included in the amplification circuit. Accordingly, the second capacitance element stores electric charge in accordance with an operation of the amplification circuit. Then the second gate driver generates the fourth gate signal for driving the fourth transistor based on the electric charge stored in the second capacitance element, so that driving stability of the fourth transistor is improved, and as a result, driving stability of the driving circuit and the liquid ejecting apparatus is improved.

What is claimed is:

1. A driving circuit that outputs a driving signal for driving a driving section, the driving circuit comprising:
    a modulation circuit configured to modulate a base driving signal that is a base of the driving signal and output a modulation signal;
    an amplification circuit configured to output, from a first output point, an amplified modulation signal obtained by amplifying the modulation signal;
    a level shift circuit configured to output, from a second output point, a level-shift amplified modulation signal obtained by shifting a potential of the amplified modulation signal; and
    a demodulation circuit configured to demodulate the level-shift amplified modulation signal and output the driving signal, wherein
    the amplification circuit includes a first gate driver that outputs, based on the modulation signal, a first gate signal and a second gate signal, a first transistor that has one end electrically coupled to the first output point and that operates based on the first gate signal, and a second transistor that has one end electrically coupled to the first output point and the other end to which a first power source voltage is supplied and that operates based on the second gate signal,
    the level shift circuit includes a second gate driver that outputs, based on the base driving signal, a third gate signal and a fourth gate signal, a third transistor that has one end electrically coupled to the second output point and the other end electrically coupled to the first output point and that operates based on the third gate signal, a fourth transistor that has one end electrically coupled to the second output point and that operates based on the fourth gate signal, a first capacitance element that has one end electrically coupled to the first output point and the other end electrically coupled to the other end of the fourth transistor, and a second capacitance element that has one end electrically coupled to the one end of the fourth transistor and the other end which is electrically coupled to the second gate driver and to which a second power source voltage is supplied,
    the driving signal includes a first period in which a first potential is fixed, a second period in which a second potential higher than the first potential is fixed, and a third period in which a third potential higher than the second potential is fixed, and
    the second gate driver outputs, in the second period, the third gate signal for controlling the third transistor to be conductive and the fourth gate signal for controlling the fourth transistor to be nonconductive.

2. The driving circuit according to claim 1, wherein the second gate driver determines, based on a potential of the base driving signal, whether the third gate signal for controlling the third transistor to be conductive and the fourth gate signal for controlling the fourth transistor to be nonconductive are to be output or the third gate signal for controlling the third transistor to be nonconductive and the fourth gate signal for controlling the fourth transistor to be conductive are to be output.

3. The driving circuit according to claim 2, wherein the second gate driver outputs,
    when a potential of the base driving signal is lower than a predetermined potential, the third gate signal for controlling the third transistor to be conductive and the fourth gate signal for controlling the fourth transistor to be nonconductive, and
    when a potential of the base driving signal is higher than the predetermined potential, the third gate signal for controlling the third transistor to be nonconductive and the fourth gate signal for controlling the fourth transistor to be conductive.

4. The driving circuit according to claim 1, wherein the second potential is smaller than a potential of the first power source voltage.

5. The driving circuit according to claim 1, further comprising:
    a base driving signal circuit configured to output the base driving signal, wherein
    the base driving signal includes a fourth period in which a fourth potential is fixed, a fifth period in which a fifth potential higher than the fourth potential is fixed, and a sixth period in which a sixth potential higher than the fifth potential is fixed, and
    the base driving signal circuit changes, based on a potential of the first power source voltage, the fifth potential.

6. The driving circuit according to claim 1, further comprising:
a base driving signal circuit configured to output the base driving signal, wherein
the base driving signal includes a fourth period in which a fourth potential is fixed, a fifth period in which a fifth potential higher than the fourth potential is fixed, and a sixth period in which a sixth potential higher than the fifth potential is fixed, and
the base driving signal circuit changes, based on a feature change of the driving section, at least one of the fourth potential and the sixth potential.

7. The driving circuit according to claim 1, further comprising:
a power source circuit configured to output the first power source voltage, wherein
the power source circuit changes, based on a feature change of the driving section, a potential of the first power source voltage.

8. The driving circuit according to claim 1, further comprising:
a power source circuit configured to output the first power source voltage, wherein
the base driving signal includes a fourth period in which a fourth potential is fixed, a fifth period in which a fifth potential higher than the fourth potential is fixed, and a sixth period in which a sixth potential higher than the fifth potential is fixed, and
the power source circuit changes, based on the fifth potential, a potential of the first power source voltage.

9. The driving circuit according to claim 1, wherein
the level shift circuit switches a reference potential of the amplified modulation signal between a seventh potential and an eighth potential higher than the seventh potential.

10. The driving circuit according to claim 9, wherein
the seventh potential is a ground potential, and the eighth potential is a potential of the first power source voltage.

11. A liquid ejecting apparatus, comprising:
an ejection portion configured to eject liquid; and
a driving circuit configured to output a driving signal for driving the ejection portion, wherein
the driving circuit includes
a modulation circuit configured to modulate a base driving signal that is a base of the driving signal and output a modulation signal,
an amplification circuit configured to output, from a first output point, an amplified modulation signal obtained by amplifying the modulation signal,
a level shift circuit configured to output, from a second output point, a level-shift amplified modulation signal obtained by shifting a potential of the amplified modulation signal, and
a demodulation circuit configured to demodulate the level-shift amplified modulation signal and output the driving signal,
the amplification circuit includes a first gate driver that outputs, based on the modulation signal, a first gate signal and a second gate signal, a first transistor that has one end electrically coupled to the first output point and that operates based on the first gate signal, and a second transistor that has one end electrically coupled to the first output point and the other end to which a first power source voltage is supplied and that operates based on the second gate signal,
the level shift circuit includes a second gate driver that outputs, based on the base driving signal, a third gate signal and a fourth gate signal, a third transistor that has one end electrically coupled to the second output point and the other end electrically coupled to the first output point and that operates based on the third gate signal, a fourth transistor that has one end electrically coupled to the second output point and that operates based on the fourth gate signal, a first capacitance element that has one end electrically coupled to the first output point and the other end electrically coupled to the other end of the fourth transistor, and a second capacitance element that has one end electrically coupled to the one end of the fourth transistor and the other end which is electrically coupled to the second gate driver and to which a second power source voltage is supplied,
the driving signal includes a first period in which a first potential is fixed, a second period in which a second potential higher than the first potential is fixed, and a third period in which a third potential higher than the second potential is fixed, and
the second gate driver outputs, in the second period, the third gate signal for controlling the third transistor to be conductive and the fourth gate signal for controlling the fourth transistor to be nonconductive.

* * * * *